(12) United States Patent
Venkatesh et al.

(10) Patent No.: US 7,171,003 B1
(45) Date of Patent: Jan. 30, 2007

(54) ROBUST AND RELIABLE ACOUSTIC ECHO AND NOISE CANCELLATION SYSTEM FOR CABIN COMMUNICATION

(75) Inventors: Saligrama R. Venkatesh, Jersey City, NJ (US); Alan M. Finn, Hebron, CT (US)

(73) Assignee: Lear Corporation, Southfield, MI (US)

( * ) Notice: Subject to any disclaimer, the term of this patent is extended or adjusted under 35 U.S.C. 154(b) by 1151 days.

(21) Appl. No.: 09/692,531

(22) Filed: Oct. 19, 2000

(51) Int. Cl.
*H04B 3/20* (2006.01)
*H04B 1/00* (2006.01)
*H04M 9/08* (2006.01)

(52) U.S. Cl. .......................... 381/66; 381/86
(58) Field of Classification Search .............. 381/86, 381/71.1, 71.2, 71.4, 71.7, 71.8, 71.11, 71.18, 381/59, 58, 94.1; 379/406.01, 406.02, 406.03, 379/406.08, 406.15
See application file for complete search history.

(56) References Cited

U.S. PATENT DOCUMENTS

| | | | | |
|---|---|---|---|---|
| 4,377,793 A | * | 3/1983 | Horna | 333/165 |
| 5,361,305 A | | 11/1994 | Easley et al. | |
| 5,610,909 A | * | 3/1997 | Shaw | 370/291 |
| 5,631,899 A | * | 5/1997 | Duttweiler | 370/291 |
| 5,646,991 A | * | 7/1997 | Sih | 379/406.08 |
| 5,706,344 A | * | 1/1998 | Finn | 379/406.09 |
| 5,796,819 A | * | 8/1998 | Romesburg | 379/406.09 |
| 5,802,184 A | | 9/1998 | Heath | |
| 5,872,852 A | | 2/1999 | Dougherty | |
| 6,040,761 A | | 3/2000 | Grasmann | |

* cited by examiner

*Primary Examiner*—Xu Mei
(74) *Attorney, Agent, or Firm*—MacMillan, Sobanski & Todd, LLC

(57) ABSTRACT

A cabin communication system for improving clarity of a voice spoken within an interior cabin having ambient noise includes an adaptive speech enhancement filter for receiving an audio signal that includes a first component indicative of the spoken voice, a second component indicative of a feedback echo of the spoken voice and a third component indicative of the ambient noise, the speech enhancement filter filtering the audio signal by removing the third component to provide a filtered audio signal, the speech enhancement filter adapting to the audio signal at a first adaptation rate, and an adaptive acoustic echo cancellation system for receiving the filtered audio signal and removing the second component in the filtered audio signal to provide an echo-cancelled audio signal, the echo cancellation signal adapting to the filtered audio signal at a second adaption rate, wherein the first adaptation rate and the second adaptation rate are different from each other so that the speech enhancement filter does not adapt in response to operation of the echo-cancellation system and the echo-cancellation system does not adapt in response to operation of the speech enhancement filter.

25 Claims, 16 Drawing Sheets

FIG. 13

```
m=20;delays=30;sig=.00;n=170;
y=filter(h,1,r)+sig*n;
htp1=ht(1:delays+m);
pn=eye(m);
L=length(ht);
ind=delays+m:m:n;
lind=length(ind);
kg=zeros(m,(lind-1) *m+1);

for j=1:lind
ind0(1:m,j)=[(j-1) *m+1:j *m] +delays;
end
htemp=ht(ind0);

for k-200:10000
ind1=k-ind0;
[htemp(:,1)k0,pn,an]=rls1(pn,y(k-1),r(ind1(:,1)),htemp(:,1),1);

for l=(ind-1) *m:-1:1
kg(:,l+1)=kg(:,l):
end kg(:,1)=k0;

for j=2:lind
htemp(:,j)=htemp(:,j)+kg(:,(j-1) *m+1)*(an-htemp(:,j)' *r(ind1(:,j)));
end
```

ROBUST AND RELIABLE ACOUSTIC ECHO AND NOISE CANCELLATION SYSTEM FOR CABIN COMMUNICATION

FIELD OF THE INVENTION

The present invention relates to improvements in voice amplification and clarification in a noisy environment, such as a cabin communication system, which enables a voice spoken within the cabin to be increased in volume for improved understanding while minimizing any unwanted noise amplification. The present invention also relates to a movable cabin that advantageously includes such a cabin communication system for this purpose. In this regard, the term "movable cabin" is intended to be embodied by a car, truck or any other wheeled vehicle, an airplane or helicopter, a boat, a railroad car and indeed any other enclosed space that is movable and wherein a spoken voice may need to be amplified or clarified.

BACKGROUND OF THE INVENTION

As anyone who has ridden in a mini-van, sedan or sport utility vehicle will know, communication among the passengers in the cabin of such a vehicle is difficult. For example, in such a vehicle, it is frequently difficult for words spoken by, for example, a passenger in a back seat to be heard and understood by the driver, or vice versa, due to the large amount of ambient noise caused by the motor, the wind, other vehicles, stationary structures passed by etc., some of which noise is caused by the movement of the cabin and some of which occurs even when the cabin is stationary, and due to the cabin acoustics which may undesirably amplify or damp out different sounds. Even in relatively quiet vehicles, communication between passengers is a problem due to the distance between passengers and the intentional use of sound-absorbing materials to quiet the cabin interior. The communication problem may be compounded by the simultaneous use of high-fidelity stereo systems for entertainment.

To amplify the spoken voice, it may be picked up by a microphone and played back by a loudspeaker. However, if the spoken voice is simply picked up and played back, there will be a positive feedback loop that results from the output of the loudspeaker being picked up again by the microphone and added to the spoken voice to be once again output at the loudspeaker. When the output of the loudspeaker is substantially picked up by a microphone, the loudspeaker and the microphone are said to be acoustically coupled. To avoid an echo due to the reproduced voice itself, an echo cancellation apparatus, such as an acoustic echo cancellation apparatus, can be coupled between the microphone and the loudspeaker to remove the portion of the picked-up signal corresponding to the voice component output by the loudspeaker. This is possible because the audio signal at the microphone corresponding to the original spoken voice is theoretically highly correlated to the audio signal at the microphone corresponding to the reproduced voice component in the output of the loudspeaker. One advantageous example of such an acoustic echo cancellation apparatus is described in commonly-assigned U.S. patent application Ser. No. 08/868,212. Another advantageous acoustic echo cancellation apparatus is described hereinbelow.

On the other hand, any reproduced noise components may not be so highly correlated and need to be removed by other means. However, while systems for noise reduction generally are well known, enhancing speech intelligibility in a noisy cabin environment poses a challenging problem due to constraints peculiar to this environment. It has been determined in developing the present invention that the challenges arise principally, though not exclusively, from the following five causes. First, the speech and noise occupy the same bandwidth, and therefore cannot be separated by band-limited filters. Second, different people speak differently, and therefore it is harder to properly identify the speech components in the mixed signal. Third, the noise characteristics vary rapidly and unpredictably, due to the changing sources of noise as the vehicle moves. Fourth, the speech signal is not stationary, and therefore constant adaptation to its characteristics is required. Fifth, there are psycho-acoustic limits on speech quality, as will be discussed further below.

One prior art approach to speech intelligibility enhancement is filtering. As noted above, since speech and noise occupy the same bandwidth, simple band-limited filtering will not suffice. That is, the overlap of speech and noise in the same frequency band means that filtering based on frequency separation will not work. Instead, filtering may be based on the relative orthogonality between speech and noise waveforms. However, the highly non-stationary nature of speech necessitates adaptation to continuously estimate a filter to subtract the noise. The filter will also depend on the noise characteristics, which in this environment are time-varying on a slower scale than speech and depend on such factors as vehicle speed, road surface and weather.

FIG. 1 is a simplified block diagram of a conventional cabin communication system (CCS) 100 using only a microphone 102 and a loudspeaker 104. As shown in the figure, an echo canceller 106 and a conventional speech enhancement filter (SEF) 108 are connected between the microphone 102 and loudspeaker 104. A summer 110 subtracts the output of the echo canceller 106 from the input of the microphone 102, and the result is input to the SEF 108 and used as a control signal therefor. The output of the SEF 108, which is the output of the loudspeaker 26, is the input to the echo canceller 106. In the echo canceller 106, on-line identification of the transfer function of the acoustic path (including the loudspeaker 104 and the microphone 102) is performed, and the signal contribution from the acoustic path is subtracted.

In a conventional acoustic echo and noise cancellation system, the two problems of removing echos and removing noise are addressed separately and the loss in performance resulting from coupling of the adaptive SEF and the adaptive echo canceller is usually insignificant. This is because speech and noise are correlated only over a relatively short period of time. Therefore, the signal coming out of the loudspeaker can be made to be uncorrelated from the signal received directly at the microphone by adding adequate delay into the SEF. This ensures robust identification of the echo canceller and in this way the problems can be completely decoupled. The delay does not pose a problem in large enclosures, public address systems and telecommunication systems such as automobile hands-free telephones. However, it has been recognized in developing the present invention that the acoustics of relatively smaller movable cabins dictate that processing be completed in a relatively short time to prevent the perception of an echo from direct and reproduced paths. In other words, the reproduced voice output from the loudspeaker should be heard by the listener at substantially the same time as the original voice from the speaker is heard. In particular, in the cabin of a moving vehicle, the acoustic paths are such that an addition of delay beyond approximately 20 ms will sound like an echo, with one version coming from the direct path and another from the loudspeaker. This puts a limit on the total processing time, which means a limit both on the amount of delay and on the length of the signal that can be processed.

Thus, conventional adaptive filtering applied to a cabin communication system may reduce voice quality by introducing distortion or by creating artifacts such as tones or echos. If the echo cancellation process is coupled with the speech extraction filter, it becomes difficult to accurately estimate the acoustic transfer functions, and this in turn leads to poor estimates of noise spectrum and consequently poor speech intelligibility at the loudspeaker. An advantageous approach to overcoming this problem is disclosed below, as are the structure and operation of an advantageous adaptive SEF.

Several adaptive filters are known for use in the task of speech intelligibility enhancement. These filters can be broadly classified into two main categories: (1) filters based on a Wiener filtering approach and (2) filters based on the method of spectral subtraction. Two other approaches, i.e. Kalman filtering and H-infinity filtering, have also been tried, but will not be discussed further herein.

Spectral subtraction has been subjected to rigorous analysis, and it is well known, at least as it currently stands, not to be suitable for low SNR (signal-to-noise) environments because it results in "musical tone" artifacts and in unacceptable degradation in speech quality. The movable cabin in which the present invention is intended to be used is just such a low SNR environment.

Accordingly, the present invention is an improvement on Wiener filtering, which has been widely applied for speech enhancement in noisy environments. The Wiener filtering technique is statistical in nature, i.e. it constructs the optimal linear estimator (in the sense of minimizing the expected squared error) of an unknown desired stationary signal, n, from a noisy observation, y, which is also stationary. The optimal linear estimator is in the form of a convolution operator in the time domain, which is readily converted to a multiplication in the frequency domain. In the context of a noisy speech signal, the Wiener filter can be applied to estimate noise, and then the resulting estimate can be subtracted from the noisy speech to give an estimate for the speech signal.

To be concrete, let y be the noisy speech signal and let the noise be n. Then Wiener filtering requires the solution, h, to the following Wiener-Hopf equation:

$$R_{ny}(t) = \sum_{s=-\infty}^{\infty} h(s) R_{yy}(t-s) \tag{1}$$

Here, $R_{ny}$ is the cross-correlation matrix of the noise-only signal with the noisy speech, $R_{yy}$ is the auto-correlation matrix of the noisy speech, and h is the Wiener filter.

Although this approach is mathematically correct, it is not immediately amenable to implementation. First, since speech and noise are uncorrelated, the cross-correlation between n and y, i.e. $R_{ny}$, is the same as the auto-correlation of the noise, $R_{nn}$. Second, both noise and speech are non-stationary, and therefore the infinite-length cross-correlation of the solution of Equation 1 is not useful. Obviously, infinite data is not available, and furthermore the time constraint of echo avoidance applies. Therefore, the following truncated equation is solved instead:

$$R_{nn}(t) = \sum_{s=1-m}^{m} h(s) R_{yy}(t-s) \tag{2}$$

Here, m is the length of the data window.

This equation can be readily solved in the frequency domain by taking Fourier Transforms, as follows:

$$S_{nn}(f) = H(f) S_{yy}(f) \tag{3}$$

Here, $S_{nn}$ and $S_{yy}$ are the Fourier Transforms, or equivalently the power spectral densities (PSDs), of the noise and the noisy speech signal, respectively. The auto-correlation of the noise can only be estimated, since there is no noise-only signal.

However, there are problems in this approach, which holds only in an approximate sense. First, the statistics of noise have to be continuously updated. Second, this approach fails to take into account the psycho-acoustics of the human ear, which is extremely sensitive to processing artifacts at even extremely low decibel levels. Neither does this approach take into account the anti-causal nature of speech or the relative stationarity of the noise. While several existing Wiener filtering techniques make use of ad hoc, non-linear processing of the Wiener filter coefficients in the hope of maintaining and improving speech intelligibility, these techniques do not work well and do not effectively address the practical problem of interfacing a Wiener filtering technique with the psycho-acoustics of speech.

As noted above, another aspect of the present invention is directed to the structure and operation of an advantageous adaptive acoustic echo canceller (AEC) for use with an SEF as disclosed herein. Of course, other adaptive SEFs may be used in the present invention provided they cooperate with the advantageous echo canceller in the manner disclosed below.

To realistically design a cabin communication system (CCS) that is appropriate for a relatively small, movable cabin, it has been recognized that the echo cancellation has to be adaptive because the acoustics of a cabin change due to temperature, humidity and passenger movement. It has also been recognized that noise characteristics are also time varying depending on several factors such as road and wind conditions, and therefore the SEF also has to continuously adapt to the changing conditions. A CCS couples the echo cancellation process with the SEF. The present invention is different from the prior art in in addressing the coupled on-line identification and control problem in a closed loop.

There are other aspects of the present invention that contribute to the improved functioning of the CCS. One such aspect relates to an improved AGC in accordance with the present invention controls amplification volume and related functions in the CCS, including the generation of appropriate gain control signals for overall gain and a dither gain and the prevention of amplification of undesirable transient signals.

It is well known that it is necessary for customer comfort, convenience and safety to control the volume of amplification of certain audio signals in audio communication systems such as the CCS. Such volume control should have an automatic component, although a user's manual control component is also desirable. The prior art recognizes that any microphone in a cabin will detect not only the ambient noise, but also sounds purposefully introduced into the cabin. Such sounds include, for example, sounds from the entertainment system (radio, CD player or even movie soundtracks) and passengers' speech. These sounds interfere with the microphone's receiving just a noise signal for accurate noise estimation.

Prior art AGC systems failed to deal with these additional sounds adequately. In particular, prior art AGC systems would either ignore these sounds or attempt to compensate for the sounds. In contrast, the present invention provides an advantageous way to supply a noise signal to be used by the AGC system that has had these additional noises eliminated therefrom.

A further aspect of the present invention is directed to an improved user interface installed in the cabin for improving the ease and flexibility of the CCS. In particular, while the CCS is intended to incorporate sufficient automatic control to operate satisfactorily once the initial settings are made, it is of course desirable to incorporate various manual controls to be operated by the driver and passengers to customize its operation. In this aspect of the present invention, the user interface enables customized use of the plural microphones and loudspeakers.

OBJECTS AND SUMMARY OF THE INVENTION

Accordingly, it is an object of the invention to provide an adaptive speech extraction filter (SEF) that avoids the problems of the prior art.

It is another object of the invention to provide an adaptive SEF that interfaces Wiener filtering techniques with the psycho-acoustics of speech.

It is yet another object of the invention to provide an adaptive SEF that is advantageously used in a cabin communication system of a moving vehicle.

It is a further object of the invention to provide a cabin communication system incorporating an advantageous adaptive SEF for enhancing speech intelligibility in a moving vehicle.

It is yet a further object of the invention to provide a moving vehicle including a cabin communication system incorporating an advantageous adaptive SEF for enhancing speech intelligibility in the moving vehicle.

It is still a further object of the invention to provide a cabin communication system with an adaptive SEF that increases intelligibility and ease of passenger communication with little or no increase in ambient noise.

It is even a further object of the present invention to provide a cabin communication system with an adaptive SEF that provide acceptable psychoacoustics, ensures passenger comfort by not amplifying transient sounds and does not interfere with audio entertainment systems.

It is also an object of the present invention to provide an adaptive AEC that avoids the problems of the prior art.

It is another object of the present invention to provide an adaptive AEC that interfaces with adaptive Wiener filtering techniques.

It is yet another object of the invention to provide an adaptive AEC that is advantageously used in a cabin communication system of a moving vehicle.

It is a further object of the invention to provide a cabin communication system incorporating an advantageous adaptive AEC for enhancing speech intelligibility in a moving vehicle.

It is yet a further object of the invention to provide a moving vehicle including a cabin communication system incorporating an advantageous adaptive AEC for enhancing speech intelligibility in the moving vehicle.

It is still a further object of the invention to provide a cabin communication system with an adaptive AEC that increases intelligibility and ease of passenger communication with little or no increase in ambient noise or echos.

It is even a further object of the present invention to provide a cabin communication system with an adaptive AEC that does not interfere with audio entertainment systems.

It is also an object of the present invention to provide an automatic gain control that avoids the difficulties of the prior art.

It is another object of the present invention to provide an automatic gain control that provides both an overall gain control signal and a dither control signal.

It is yet another object of the present invention to provide an automatic gain control that precludes the amplification or reproduction of undesirable transient sounds.

It is also an object of the present invention to provide a user interface that facilitates the customized use of the inventive cabin communication system.

In accordance with these objects, one aspect of the present invention is directed to a cabin communication system for improving clarity of a voice spoken within an interior cabin having ambient noise, the cabin communication system comprising a microphone for receiving the spoken voice and the ambient noise and for converting the spoken voice and the ambient noise into an audio signal, the audio signal having a first component corresponding to the spoken voice and a second component corresponding to the ambient noise, a speech enhancement filter for removing the second component from the audio signal to provide a filtered audio signal, the speech enhancement filter removing the second component by processing the audio signal by a method taking into account elements of psycho-acoustics of a human ear, and a loudspeaker for outputting a clarified voice in response to the filtered audio signal.

Another aspect of the present invention is directed to a cabin communication system for improving clarity of a voice spoken within an interior cabin having ambient noise, the cabin communication system comprising an adaptive speech enhancement filter for receiving an audio signal that includes a first component indicative of the spoken voice, a second component indicative of a feedback echo of the spoken voice and a third component indicative of the ambient noise, the speech enhancement filter filtering the audio signal by removing the third component to provide a filtered audio signal, the speech enhancement filter adapting to the audio signal at a first adaptation rate, and an adaptive acoustic echo cancellation system for receiving the filtered audio signal and removing the second component in the filtered audio signal to provide an echo-cancelled audio signal, the echo cancellation signal adapting to the filtered audio signal at a second adaption rate, wherein the first adaptation rate and the second adaptation rate are different from each other so that the speech enhancement filter does not adapt in response to operation of the echo-cancellation system and the echo-cancellation system does not adapt in response to operation of the speech enhancement filter.

Another aspect of the present invention is directed to an automatic gain control for a cabin communication system for improving clarity of a voice spoken within a movable interior cabin having ambient noise, the automatic gain control comprising a microphone for receiving the spoken voice and the ambient noise and for converting the spoken voice and the ambient noise into a first audio signal having a first component corresponding to the spoken voice and a second component corresponding to the ambient noise, a filter for removing the second component from the first audio signal to provide a filtered audio signal, an acoustic echo canceller for receiving the filtered audio signal in accordance with a supplied dither signal and providing an echo-cancelled audio signal, a control signal generating circuit for generating a first automatic gain control signal in response to a noise signal that corresponds to a current speed of the cabin, the first automatic gain control signal controlling a first gain of the dither signal supplied to the filter, the control signal generating circuit also for generating a second automatic gain control signal in response to the noise signal, and a loudspeaker for outputting a reproduced voice in response to the echo-cancelled audio signal with a second gain controlled by the second automatic gain control signal.

Another aspect of the present invention is directed to an automatic gain control for a cabin communication system for improving clarity of a voice spoken within a movable interior cabin having ambient noise, the ambient noise intermittently including an undesirable transient noise, the automatic gain control comprising a microphone for receiving the spoken voice and the ambient noise and for converting the spoken voice and the ambient noise into a first audio signal, the first audio signal including a first component corresponding to the spoken voice and a second component corresponding to the ambient noise, a parameter estimation processor for receiving the first audio signal and for determining parameters for deciding whether or not the second component corresponds to an undesirable transient noise, decision logic for deciding, based on the parameters, whether or not the second component corresponds to an undesirable transient signal, a filter for filtering the first audio signal to provide a filtered audio signal, a loudspeaker for outputting a reproduced voice in response to the filtered audio signal with a variable gain at a second location in the cabin, and a control signal generating circuit for generating an automatic gain control signal in response to the decision logic, wherein when the decision logic decides that the second component corresponds to an undesirable transient signal, the control signal generating circuit generates the automatic gain control signal so as to gracefully set the gain of the loudspeaker to zero for fade-out.

Another aspect of the present invention is directed to an improved user interface installed in the cabin for improving the ease and flexibility of the CCS These and other objects, features and advantages of the present invention will become apparent from the following detailed description of the preferred embodiments taken in connection with the attached drawings.

BRIEF DESCRIPTION OF THE DRAWINGS

FIG. 13 illustrates an algorithm for Recursive Least Squares (RLS) block processing in the AEC.

DETAILED DESCRIPTION OF THE PREFERRED EMBODIMENTS

Figure 2:
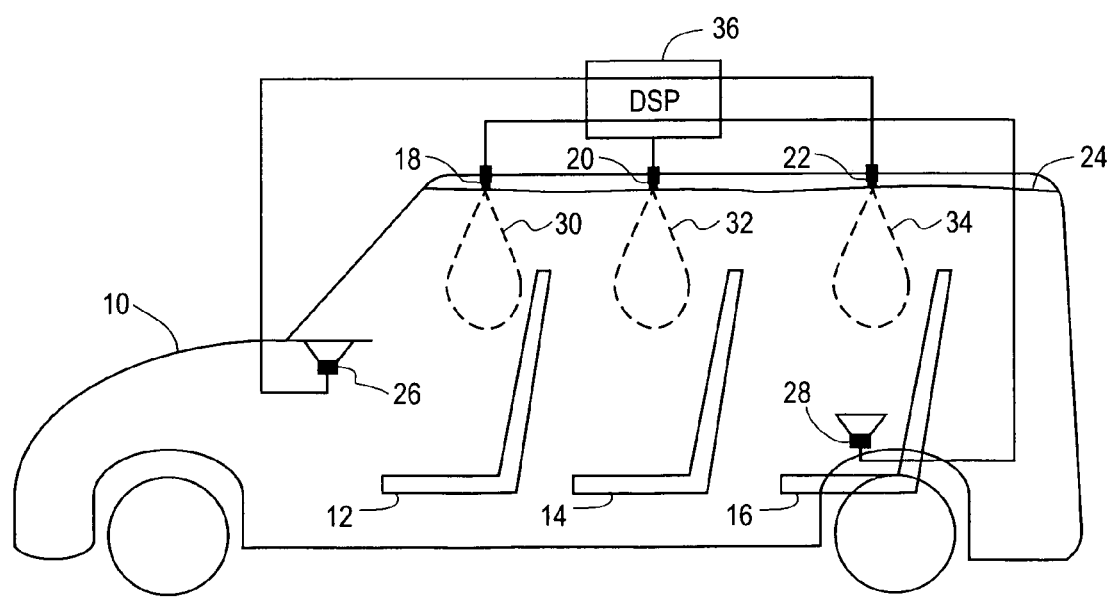
FIG. 2 is an illustrative drawing of a vehicle incorporating a first embodiment of the present invention.

Before addressing the specific mathematical implementation of the SEF in accordance with the present invention, it is helpful to understand the context wherein it operates. FIG. 2 illustrates a first embodiment of the present invention as implemented in a mini-van 10. As shown in FIG. 2, the mini-van 10 includes a driver's seat 12 and first and second passenger seats 14, 16. Associated with each of the seats is a respective microphone 18, 20, 22 adapted to pick up the spoken voice of a passenger sitting in the respective seat. Advantageously, but not necessarily, the microphone layout may include a right and a left microphone for each seat. In developing the present invention, it has been found that it is advantageous in enhancing the clarity of the spoken voice to use two or more microphones to pick up the spoken voice from the location where it originates, e.g. the passenger or driver seat, although a single microphone for each user may be provided within the scope of the invention. This can be achieved by beamforming the microphones into a beam-formed phase array, or more generally, by providing plural microphones whose signals are processed in combination to be more sensitive to the location of the spoken voice, or even more generally to preferentially detect sound from a limited physical area. The plural microphones can be directional microphones or omnidirectional microphones, whose combined signals define the detecting location. The system can use the plural signals in processing to compensate for differences in the responses of the microphones. Such differences may arise, for example, from the different travel paths to the different microphones or from different response characteristics of the microphones themselves. As a result, omnidirectional microphones, which are substantially less expensive than directional microphones or physical beam-formed arrays, can be used. When providing the cabin communication system in possibly millions of cars, such a practical consideration as cost can be a most significant factor. The use of such a system of plural microphones is therefore advantageous in a movable vehicle cabin, wherein a large, delicate and/or costly system may be undesirable.

Referring again to FIG. 2, the microphones 18–22 are advantageously located in the headliner 24 of the mini-van 10. Also located within the cabin of the mini-van 10 are plural loudspeakers 26, 28. While three microphones and two loudspeakers are shown in FIG. 2, it will be recognized that the number of microphones and loudspeakers and their respective locations may be changed to suit any particular cabin layout. If the microphones 18, 20, 22 are directional or form an array, each will have a respective beam pattern 30, 32, 34 indicative of the direction in which the respective microphone is most sensitive to sound. If the microphones 18–22 are omnidirectional, it is well known in the art to provide processing of the combined signals so that the omnidirectional microphones have effective beam patterns when used in combination.

The input signals from the microphones 18–22 are all sent to a digital signal processor (DSP) 36 to be processed so as to provide output signals to the loudspeakers 26, 28. The DSP 36 may be part of the general electrical module of the vehicle, part of another electrical system or provided independently. The DSP 36 may be embodied in hardware, software or a combination of the two. It will be recognized that one of ordinary skill in the art, given the processing scheme discussed below, would be able to construct a suitable DSP from hardware, software or a combination without undue experimentation.

Figure 3:
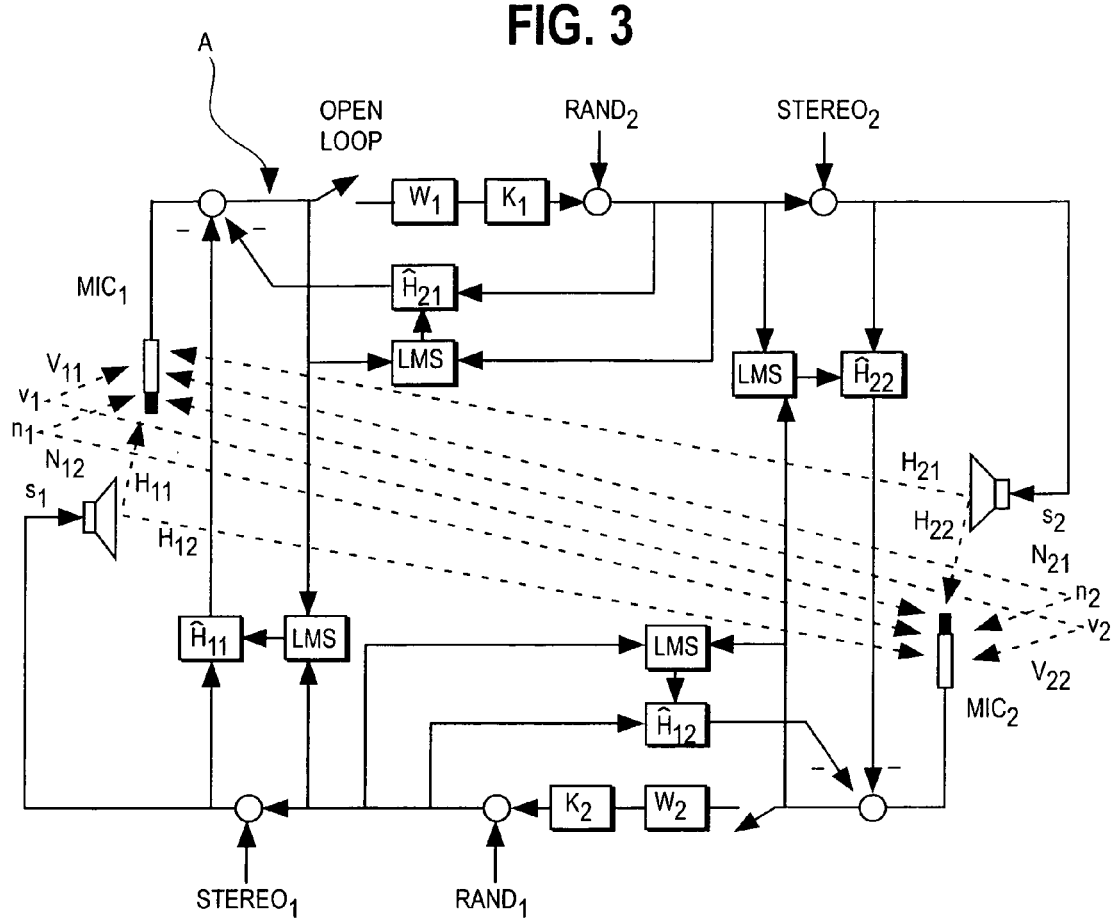
FIG. 3 is a block diagram explanatory of the multi-input, multi-output interaction of system elements in accordance with the embodiment of FIG. 2.

Thus, the basic acoustic system embodied in the layout of FIG. 2 consists of multiple microphones and loudspeakers in a moderately resonant enclosure. FIG. 3 illustrates a block diagram explanatory of elements in this embodiment, having two microphones, $mic_1$ and $mic_2$, and two loudspeakers $l_1$ and $l_2$. Microphone $mic_1$ picks up six signal components, including first voice $v_1$ with a transfer function $V_{11}$ from the location of a first person speaking to microphone $mic_1$, second voice $v_2$ with a transfer function $V_{21}$ from the location of a second person speaking to microphone $mic_1$, first noise $n_1$ with a transfer function $N_{11}$ and second noise $n_2$ with a transfer function $N_{21}$. Microphone $mic_1$ also picks up the output $s_1$ of loudspeaker $l_1$ with a transfer function of $H_{11}$ and the output $s_2$ of loudspeaker $l_2$ with a transfer function $H_{21}$. Microphone $mic_2$ picks up six corresponding signal components. The microphone signal from microphone $mic_1$ is echo cancelled ($-\hat{H}_{11}s_1-\hat{H}_{22}s_2$), using an echo canceller such as the one disclosed herein, Wiener filtered ($W_1$) using the advantageous Wiener filtering technique disclosed below, amplified ($K_1$) and output through the remote loudspeaker $l_2$. As a result, for example, the total signal at point A in FIG. 3 is $(H_{11}-\hat{H}_{11})s_1+(H_{21}-\hat{H}_{21})s_2+V_{11}v_1+V_{21}v_2+N_{11}n_1+N_{21}n_2$.

Certain aspects of the advantageous CCS shown in FIG. 3 are disclosed in concurrently filed, commonly assigned applications. For example, each of the blocks LMS identifies the adaptation of echo cancellers as in the commonly-assigned application mentioned above, or advantageously an echo cancellation system as described below. The CCS uses a number of such echo cancellers equal to the product of the number of acoustically independent loudspeakers and the number of acoustically independent microphones, so that the product here is four.

Additionally, random noises $rand_1$ and $rand_2$ are injected and used to identify the open loop acoustic transfer functions. This happens under two circumstances: initial system identification and during steady state operation. During initial system identification, the system could be run open loop (switches in FIG. 3 are open) and only the open loop system is identified. Proper system operation depends on adaptive identification of the open loop acoustic transfer functions as the acoustics change. However, during steady state operation, the system runs closed loop. While normal system identification techniques would identify the closed loop system, the system identification may be performed using the random noise, as the random noise is effectively blocked by the advantageous Wiener SEF, so that the open loop system is still the one identified. Further details of the random noise processing are disclosed in another concurrently filed, commonly assigned application.

Figure 4:
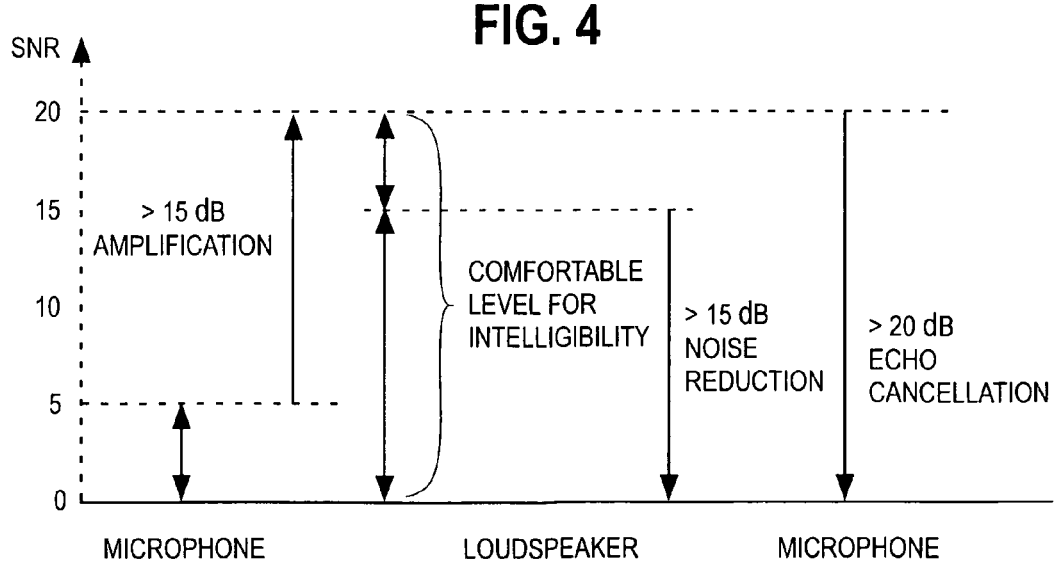
FIG. 4 is an experimentally derived acoustic budget for implementation of the present invention.

A CCS also has certain acoustic requirements. Thus, the present inventors have determined that a minimum of 20 dB SNR provides comfortable intelligibility for front to rear communication in a mini-van. The SNR is measured as 20 $log_{10}$ of the peak voice voltage to the peak noise voltage. Therefore, the amount of amplification and the amount of ambient road noise reduction will depend on the SNR of the microphones used. For example, the microphones used in a test of the CCS gave a 5 dB SNR at 65 mph, with the SNR decreasing with increasing speed. Therefore, at least 15 dB of amplification and 15 dB of ambient road noise reduction is required. To provide a margin for differences in people's speech and hearing, advantageously the system may be designed to provide 20 dB each. Similarly, at least 20 dB of acoustic echo cancellation is required, and 25 dB is advantageously supplied. FIG. 4 illustrates an advantageous experimentally derived acoustic budget. The overall system performance is highly dependent on the SNR and the quality of the raw microphone signal. Considerable attention must be give to microphone mounting, vibration isolation, noise rejection and microphone independence. However, such factors are often closely dependent on the particular vehicle cabin layout.

As noted above, the present invention differs from the prior art in expressly considering psycho-acoustics. One self-imposed aspect of that is that passengers should not hear their own amplified voices from nearby loudspeakers. This imposes requirements on the accuracy of echo cancellation and on the rejection of the direct path from a person to a remote microphone, i.e. microphone independence. The relative amplitude at multiple microphones for the same voice sample is a measure of microphone independence. A lack of microphone independence results in a person hearing his own speech from a nearby loudspeaker because it was received and sufficiently amplified from a remote microphone. Microphone independence can be achieved by small beamforming arrays over each seat, or by single directional microphones or by appropriately interrelated omnidirectional microphones. However, the latter two options provide reduced beamwidth, which results in significant changes in the microphone SNR as a passenger turns his head from side to side or toward the floor.

Figure 5:
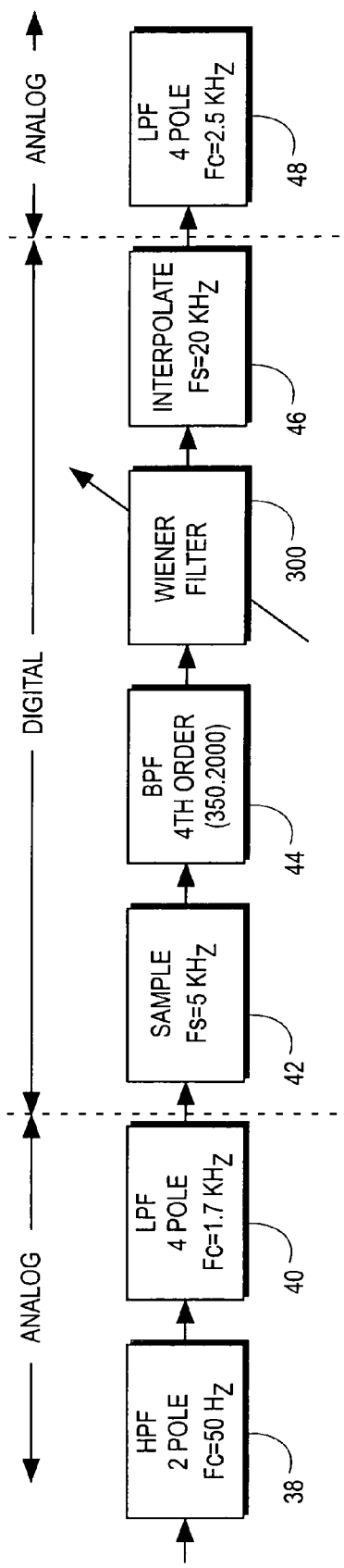
FIG. 5 is a block diagram of filtering in the present invention.

Another aspect of acceptable psycho-acoustics is good voice quality. In the absence of an acceptable metric of good voice quality, which is as yet unavailable, the voice quality is assessed heuristically as the amount of distortion and the perceptibility of echos. Voice distortion and echos result from both analog and digital CCS filtering. FIG. 5 is a block diagram of filtering circuitry provided in a CCS incorporating the SEF according to the present invention. The first two elements are analog, using a High Pass Filter (HPF) 2-pole filter 38 and a Low Pass Filter (LPF) 4-pole filter 40. The next four elements are digital, including a sampler 42, a $4^{th}$ order Band Pass Filter (BPF) 44, the Wiener SEF 300 in accordance with the present invention and an interpolator 44. The final element is an analog LPF 4-pole filter 46. The fixed analog and digital bandpass filters and the sample rate impose bandwidth restrictions on the processed voice. It has been found in developing the present invention that intelligibility is greatly improved with a bandwidth as low as 1.7 KHz, but that good voice quality may require a bandwidth as high as 4.0 KHz. Another source of distortion is the quantization by the A/D and D/A converters (not illustrated). While the quantization effects have not been fully studied, it is believed that A/D and D/A converters with a dynamic range of 60 dB from quietest to loudest signals will avoid significant quantization effects. The dynamic range of the A/D and D/A converters could be reduced by use of an automatic gain control (AGC). This is not preferred due to the additional cost, complexity and potential algorithm instability with the use of A/D and D/A AGC.

In addition, there will always be a surround sound effect, since the voice amplification is desirably greater than the natural acoustic attenuation. As noted above, distinct echos result when the total CCS and audio delays exceed 20 ms. The CCS delays arise from both filtering and buffering. In the preferred embodiment of the invention, the delays advantageously are limited to 17 ms.

Having described the context of the present invention, the following discussion will set forth the operation and elements of the novel SEF 300. In designing the SEF 300, it is unique to the present invention's speech enhancement by Wiener filtering to exploit the human perception of sound (mel-filtering), the anti-causal nature of speech (causal noise filtering), and the (relative) stationarity of the noise (temporal and frequency filtering).

First, it is commonly known that the human ear perceives sound at different frequencies on a non-linear scale called the mel-scale. In other words, the frequency resolution of the human ear degrades with frequency. This effect is significant in the speech band (300 Hz to 4 KHz) and therefore has a fundamental bearing on the perception of speech. A better SNR can be obtained by smoothing the noisy speech spectrum over larger windows at higher frequencies. This operation is performed as follows: if Y(f) is the frequency spectrum of noisy speech at frequency f, then the mel-filtering consists of computing:

$$\tilde{Y}(f_0) = \frac{\sum_{k=-L}^{L} \pi_k Y(f_0 + k)}{\sum_{k=-L}^{L} \pi_k} \quad (4)$$

Here, the weights $\pi_k$ are advantageously chosen as the inverse of the noise power spectral densities at the frequency. The length L progressively increases with frequency in accordance with the mel-scale. The resulting output $Y(f_0)$ has a high SNR at high frequencies with negligible degradation in speech quality or intelligibility.

Second, speech, as opposed to many other types of sound and in particular noise, is anti-causal or anticipatory. This is well known from the wide-spread use of tri-phone and bi-phone models of speech. In other words, each sound in turn is not independent, but rather depends on the context, so that the pronunciation of a particular phoneme often depends on a future phoneme that has yet to be pronounced. As a result, the spectral properties of speech also depend on context. This is direct contrast to noise generation, where it is well known that noise can be modeled as white noise passing through a system. The system here corresponds to a causal operation (as opposed to the input speech), so that the noise at any instant of time does not depend on its future sample path.

The present invention exploits this difference in causality by solving an appropriate causal filtering problem, i.e. a causal Wiener filtering approach. However in developing the present invention it was also recognized that straightforward causal filtering has severe drawbacks. First, a causal Wiener filtering approach requires spectral factorization, which turns out to be extremely expensive computationally and is therefore impractical. Second, the residual noise left in the extracted speech turned out to be perceptibly unpleasant.

It was first considered reasonable to believe that it was the power spectrum of the residual noise which is of concern, rather than the instantaneous value of the residual noise. This suggested solving the following optimization problem:

Find a causal filter that minimizes:

$$\|S_{nn}(f) - H(f)S_{yy}(f)\|_2 \quad (5)$$

This is the same as the previous formulation of the problem in Equation (3), with the addition of constraints on causality and minimization of the residual power spectrum.

However, this solution also was found to suffer from drawbacks. From psycho-acoustics it is known that the relative amount of white noise variation required to be just noticeable is a constant 5%, independent of the sound pressure level. Since the noise excitation is broadband, it is reasonable to assume that the white noise model for just noticeable variation is appropriate. This would mean that a filter that keeps the spectral noise spectral density relatively constant over time is appropriate.

The solution of Equation 5 fails to satisfy this requirement. The reason is that a signal y which suddenly has a large SNR at a single frequency results in a filter H that has a large-frequency component only for those frequencies that have a large SNR. In contrast, for those frequencies with low SNR, the filter H will be nearly zero. As a result, with this filter H the residual noise changes appreciably from time frame to time frame, which can result in perceptible noise.

The present invention resolves these problems by formulating a weighted least squares problem, with each weight inversely proportional to the energy in the respective frequency bin. This may be expressed mathematically as follows:

$$\min_{H \text{ causal}} \sum_f ((S_{yy}(f))^{-1}|S_{nn}(f) - H(f)S_{yy}(f)|)^2 \qquad (6)$$

The above formulation has the following solution:

$$H(f) = \left\{\frac{S_{nn}(f)}{S_{yy}(f)}\right\}_+ \qquad (7)$$

Here, the symbol "+" denotes taking the causal part. The computation of the above filter domain is relatively simple and straightforward, requiring only two Fourier transforms, and for an appropriate data length the Fourier Transforms themselves can be implemented by a Fast Fourier Transform (FFT).

Variants of Equation (7) can also be used wherein a smoothed weight is used based on past values of energy in each frequency bin or based on an average based on neighboring bins. This would obtain increasingly smoother transitions in the spectral characteristics of the residual noise. However, these variants will increase the required computational time.

It is conventional that the Wiener filter length, in either the frequency or time domain, is the same as the number of samples. It is a further development of the present invention to use a shorter filter length. It has been found that such a shorter filter length, most easily implemented in the time domain, results in reduced computations and better noise reduction. The reduced-length filter may be of an a priori fixed length, or the length may be adaptive, for example based on the filter coefficients. As a further feature, the filter may be normalized, e.g. for unity DC gain.

A third advantageous feature of the present invention is the use of temporal and frequency smoothing. In particular, the denominator in Equation 7 for the causal filter is an instantaneous value of the power spectrum of the noisy speech signal, and therefore it tends to have a large variance compared to the numerator, which is based on an average over a longer period of time. This leads to fast variation in the filter in addition to the fact that the filter is not smooth. Smoothing in both time and frequency are used to mitigate this problem.

First, the speech signal is weighted with a $\cos^2$ weighting function in the time domain. Then the Wiener filter is smoothed temporally, as follows:

$$H_n(f) = \theta H_n(f) + (1-\theta)H_{n-1}(f) \qquad (8)$$

Here the subscript n denotes the filter at time n. Finally, the Wiener filter is smoothed in frequency, as follows:

$$H_n(f) = \sum_{s=-m}^{m} w(s)H_n(f+s) \qquad (9)$$

Here the weights, w, can be frequency dependent.

In addition to the factors discussed above, it has been recognized in developing the present invention that the estimation of the noise spectrum is critical to the success of speech extraction. In many conventional speech enhancement applications, a voice activity detector (VAD) is used to determine when there is no speech. These intervals are then used to update the power spectrum of the noise. This approach may be suitable in situations in which the noise spectrum does not change appreciably with time, and in which noise and speech can be reliably distinguished. However, it has been recognized in developing the present invention that in a movable cabin environment, the noise characteristics often do change relatively rapidly and the voice to noise ratio is very low. To operate properly, a VAD would have to track these variations effectively so that no artifacts are introduced. This is recognized to be difficult to achieve in practice.

It has further recognized in developing the present invention that a VAD is not even necessary, since the duration of speech, even when multiple people are speaking continuously, is far less than the duration when there is only noise. Therefore, it is appropriate to merely provide a weighted average of the estimated noise spectrum and the spectrum of the noisy speech signal, as follows:

$$S^k{}_{nn}(f) = \delta S^{k-1}{}_{nn}(f) + (1-\delta)((\gamma H(f) + (1-\gamma))Y(f))^2 \qquad (10)$$

Figure 6:
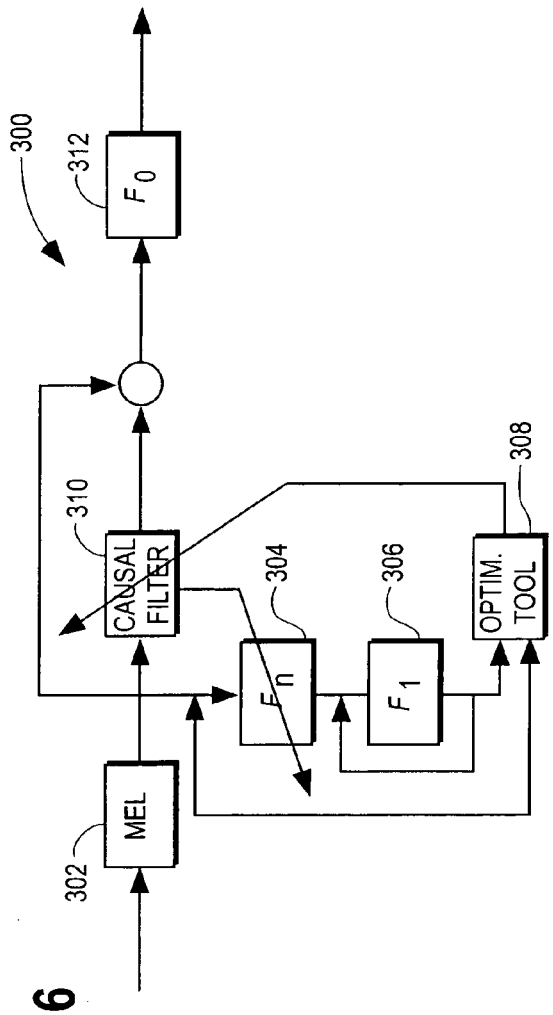
FIG. 6 is a block diagram of the SEF of the present invention.

With all of the above considerations in mind, FIG. 6 illustrates the structure of an embodiment of the advantageous Wiener SEF 300. In this embodiment, the noisy speech signal is sampled at a frequency of 5 KHz. A buffer block length of 32 samples is used, and a 64 sample window is used at each instant to extract speech. An overlap length of 32 samples is used, with the proviso that the first 32 samples of extracted speech from a current window are averaged with the last 32 samples of the previous window. The sampling frequency, block length, sample window and overlap length may be varied, as is well known in the art and illustrated below without departing from the spirit of the invention.

Figure 7:
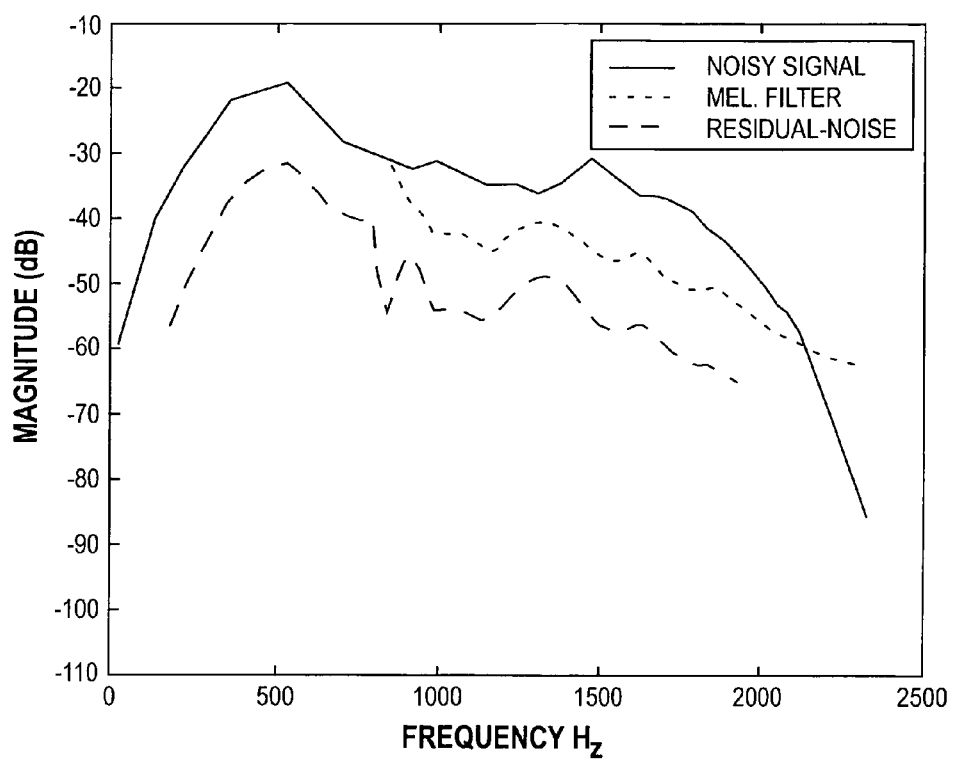
FIG. 7 is a plot of Wiener filtering performance by the SEF of FIG. 6.

In the block diagram of FIG. 6, the noisy speech is first mel-filtered in mel-filter 302. This results in improving the SNR at high frequencies. A typical situation is shown in FIG. 7, where mel-filtering with the SEF 300 primarily improves the SNR above 1000 Hz. Next, in FIG. 6, the speech must be enhanced at low frequencies where fixed filtering schemes such as mel-filtering are ineffective. This is achieved by making use of adaptive filtering techniques. The mel-filtered output passes through the adaptive filter $F_n$ 304 to produce an estimate of the noise update. This estimate is integrated with the previous noise spectrum using a one-pole filter $F_1$ 306 to produce an updated noise spectrum. An optimization tool 308 inputs the updated noise spectrum and the mel-filtered output from mel-filter 302 and uses an optimization algorithm to produce a causal filter update. This causal filter update is applied to update a causal filter 310 receiving the mel-filtered output. The updated causal filter 310 determines the current noise estimate. This noise estimate is subtracted from the mel-filtered output to obtain a speech estimate that is amplified appropriately using a filter $F_0$ 312.

Figure 8:
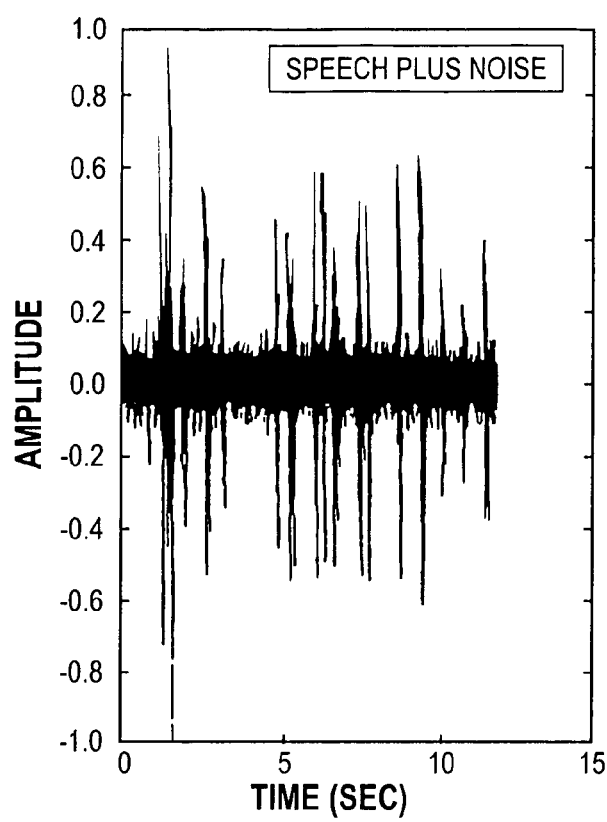
FIG. 8 is a plot of speech plus noise.
Figure 9:
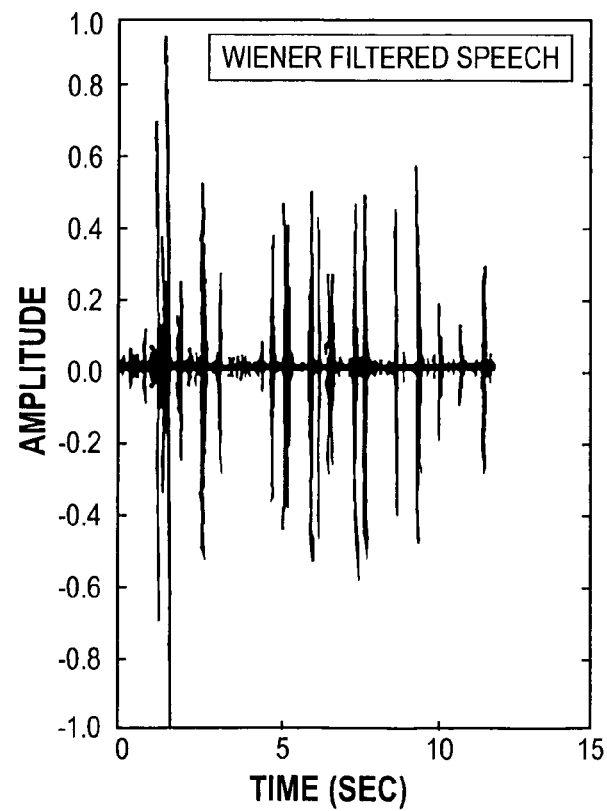
FIG. 9 is a plot of the speech plus noise of FIG. 8 after Wiener filtering by the SEF of FIG. 6.

The effect of the filtering algorithm on a typical noisy speech signal taken in a mini-van traveling at approximately 65 mph is shown in FIGS. 8 and 9. FIG. 8 illustrates the noisy speech signal and FIG. 9 illustrates the corresponding Wiener-filtered speech signal, both for the period of 12 seconds. A comparison of the two plots demonstrates substantial noise attenuation.

Also tested was s a Matlab implementation of the algorithm in which the Wiener filter sample window has been increased to 128 points while keeping the buffer block length at 32. This results in an overlap of 96 samples. The resulting noise cancellation performance is better. Moreover, by the use of conventional highly optimized real-to-complex and complex-to-real transforms, the computational requirements are approximately the same as for the smaller sample window.

The corresponding noise power spectral densities are shown in FIG. 7. These correspond to the periods of time in the 12 second interval above when there was no speech. The three curves respectively correspond to the power spectral density of the noisy signal, the mel-smoothed signal and the residual noise left in the de-noised signal. It is clear from FIG. 7 that mel-smoothing results in substantial noise reduction at high frequencies. Also, it can be seen that the residual noise in the Wiener filtered signal is of the order of 15 dB below the noise-only part of the noise plus speech signal uniformly across all frequencies.

Figure 10:
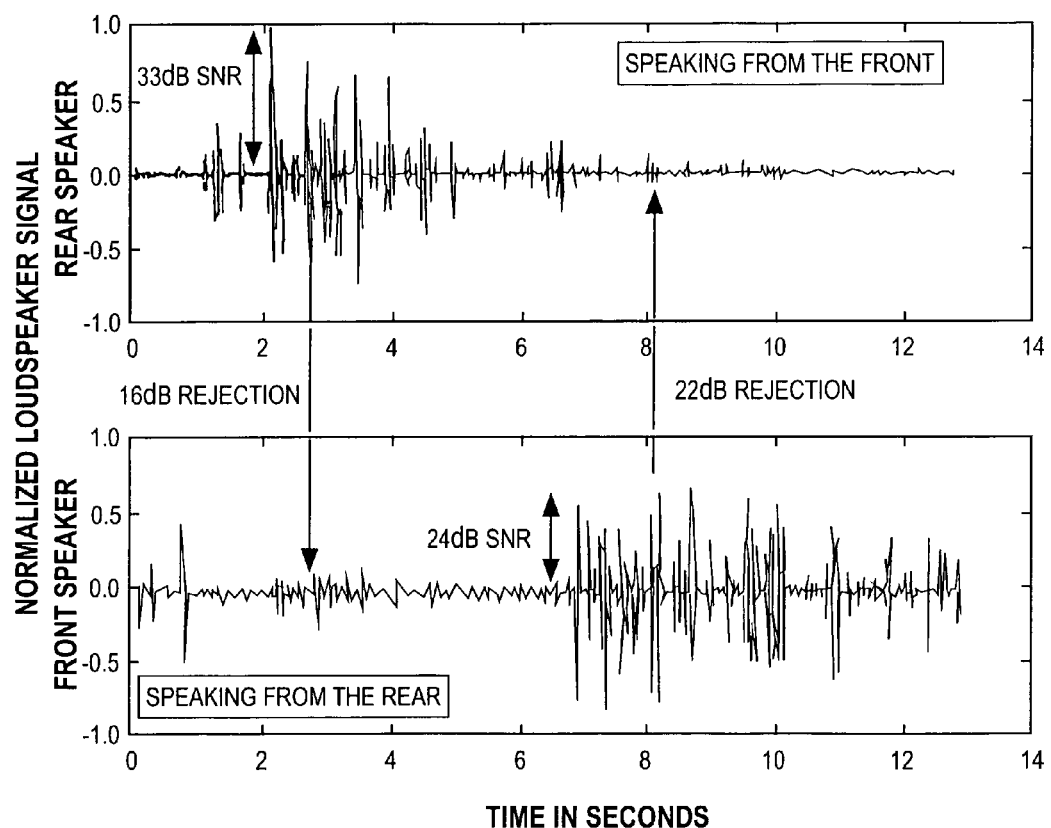
FIG. 10 is a plot of actual test results.

In an actual test of the CCS incorporating the advantageous SEF in combination with the advantageous acoustic echo canceller disclosed below, the performance of the system was measured in a mini-van after 15 minutes at 70 mph. Audio recordings were taken at 5 KHz. The directional microphones, their mounting and the natural acoustic attenuation of the cabin resulted in between 16 dB and 22 dB of microphone independence. The reproduced loudspeaker signals had between 24 dB and 33 dB of peak voice to peak noise SNR. The acoustic echo canceller also performed well, as will be discussed below. FIG. 10 illustrates the results. Therefore it was determined that the CCS performance met or exceeded all microphone independence, echo cancellation and noise reduction specifications.

The discussion will now address the design of the advantageous AEC 400 in accordance with the present invention. For purposes of easy understanding, the following discussion will be directed to a single input-single output system, i.e. one microphone and one loudspeaker. However, it will be well understood by those of ordinary skill in the art that the analysis can be expanded to a multiple input-multiple output system.

Figure 11:
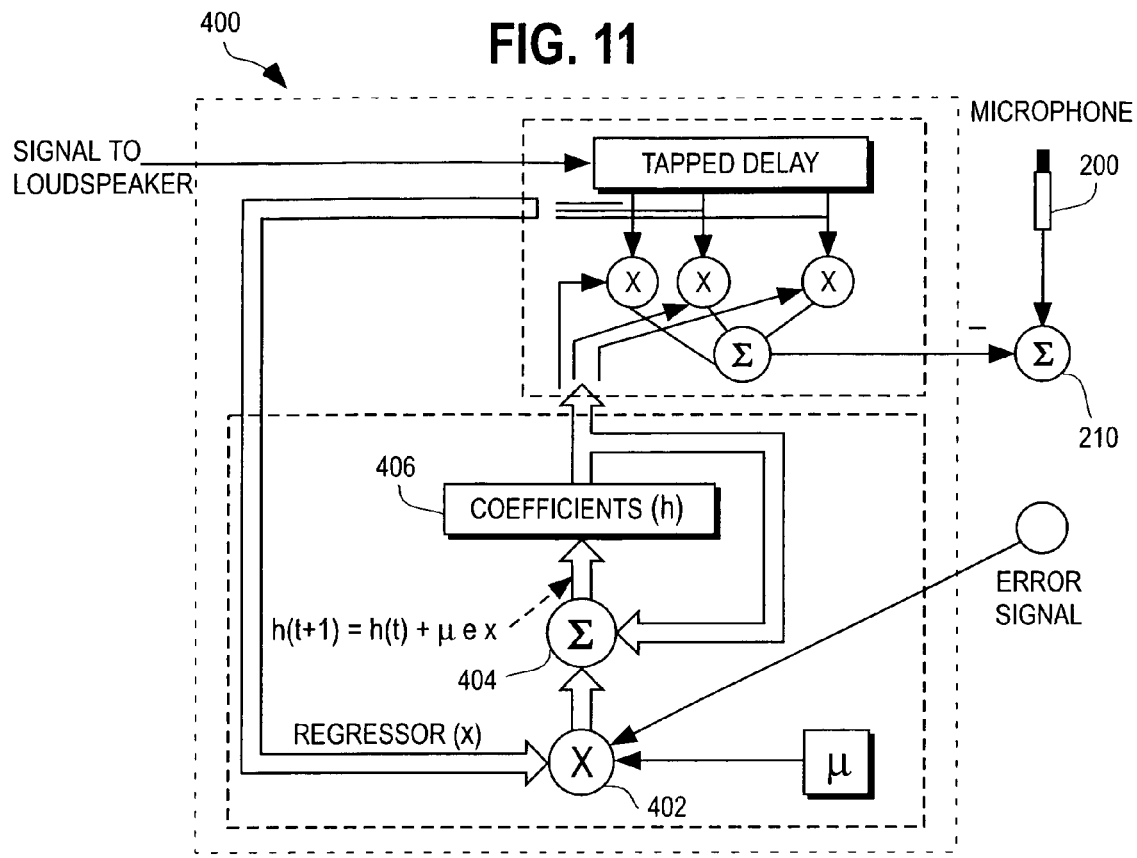
FIG. 11 is a block diagram of an embodiment of the AEC of the present invention.

As a first point, a robust acoustic echo canceller requires accurate identification of the acoustic transfer function from loudspeaker to the microphone. This means that if the relation of the loudspeaker and microphone is h and the coefficients of the AEC 400 are $\hat{h}$, then ideally $h-\hat{h}=0$. In such case, the AEC is truly measuring h, not something else. If the system h is properly identified in an initial open loop operation, then $\hat{h}$ will be initially correct. However, over time, for example over ½ hour, h will begin to drift. Therefore, it is important to keep $\hat{h}$ accurate in closed loop operation for a robust system. In the present invention, the underlying theme in developing robust adaption is to evolve a strategy to ensure independence of noise and the loudspeaker output. FIG. 11 illustrates a block diagram of the advantageous AEC 400.

In FIG. 11, the signal from microphone 200 is fed to a summer 210, which also receives a processed output signal, so that its output is an error signal (e). The error signal is fed to a multiplier 402. The multiplier also receives a parameter μ (mu), which is the step size of an unnormalized Least Mean Squares (LMS) algorithm which estimates the acoustic transfer function. Normalization, which would automatically scale mu, is advantageously not done so as to save computation. If the extra computation could be absorbed in a viable product cost, then normalization would advantageously be used. The value of mu is set and used as a fixed step size, and is significant to the present invention, as will be discussed below.

Referring back to FIG. 11, the multiplier 402 also receives the regressor (x) and produces an output that is added to a feedback output in summer 404, with the sum being fed to a accumulator 406 for storing the coefficients ($\hat{h}$) of the transfer function. The output of the accumulator 406 is the feedback output fed to summer 404. This same output is then fed to a combination delay circuit, or Finite Impulse Response (FIR) filter, in which the echo signal is computed. The echo signal is then fed to summer 210 to be subtracted from the input signal to yield the error signal (e).

The value of mu controls how fast the AEC 400 adapts. It is an important feature of the present invention that mu is advantageously set in relation to the step size of the SEF to make them sufficiently different in adaptation rate that they do not adapt to each other. Rather, they each adapt to the noise and speech signals and to the changing acoustics of the CCS.

The present invention also recognizes that the AEC 400 does not need to adapt rapidly. The most dynamic aspect of the cabin acoustics found so far is temperature, and will be addressed below. Temperature, and other changeable acoustic parameters such as the number and movement of passengers, change relatively slowly compared to speech and noise. To keep the adaptation rates of the AEC 400 and the SEF 300 separated as much as possible to minimize their interaction, it is noted that some aspects of the Wiener SEF 300 are fast, so that again the adaptation rate of the echo canceller should be slow.

Since the LMS algorithm is not normalized, the correct step size is dependent on the magnitude of the echo cancelled microphone signals. To empirically select a correct value for mu, the transfer functions should be manually converged, and then the loop is closed and the cabin subjected to changes in temperature and passenger movement. Any increase in residual echo or bursting indicates that mu is too small. Thereafter, having tuned any remaining parameters in the system, long duration road tests can be performed. Any steady decrease in voice quality during a long road test indicates that mu may be too large. Similarly, significant changes in the transfer functions before and after a long road trip at constant temperature can also indicate that mu may be too large.

To manually cause convergence of the transfer functions, the system is run open loop with a loud dither, see below, and a large mu, e.g. 1.0 for a mini-van. The filtered error sum is monitored until it no longer decreases, where the filtered error sum is a sufficiently Loss Pass Filtered sum of the squared changes in transfer function coefficients. Mu is progressively set smaller while there is no change in the filtered error sum until reaching a sufficiently small value. Then the dither is set to its steady state value.

The actual convergence rate of the LMS filter is made a submultiple of $F_s$ (5 KHz in this example). The slowest update that does not compromise voice quality is desirable, since that will greatly reduce the total computational requirements. Decreasing the update rate of the LMS filter will require a larger mu, which in turn will interfere with voice quality through the interaction of the AEC 400 and the SEF 300.

As a specific advantageous example, the step size mu for the AEC 400 is set to 0.01, based on empirical studies. Corresponding to this mu, the step size β (beta) for the SEF 300, which again is based on empirical studies, is set to 0.0005. The variable beta is one of the overall limiting parameters of the CCS, since it controls the rate of adaptation of the long term noise estimate. It has been found that it is important for good CCS performance that beta and mu be related as:

$$\beta < < \frac{\mu}{k} < < \frac{F_s}{n}. \qquad (11)$$

Here k is the value of the variable update-every for the AEC 400 (2 in this example) and n is the number of samples accumulated before block processing by the SEF 300 (32 in this example). In other words, the adaptation rate of the long term noise estimate must be much smaller than the the AEC adaptation rate, which must be much smaller than the basic Wiener filter rate. The rate of any new adaptive algorithms added to the CCS, for example an automatic gain control based on the Wiener filter noise estimate, should be outside the range of these parameters. For proper operation, the adaptive algorithms must be separated in rate as much as possible.

Mathematically, in the single input-single output CCS, if y(t) is the input to the microphone and u(t) is the speaker output, then the two are related by:

$$y(t) = H^* u(t) + s(t) + n(t) \qquad (12)$$

Here, n(t) is the noise, s(t) is the speech signal from a passenger, i.e. the spoken voice, received at the microphone, and H is the acoustic transfer function.

There are two problems resulting from closed loop operation, wherein u is a function of past values of s and n. First, n(t) could be correlated with u(t). Second, s(t) is colored for the time scale of interest, which implies again that u(t) and s(t) are correlated. Several methods have been considered to overcome these problems and three are proposed herein: introducing dither, using block recursive adaptive algorithms and compensating for temperature, voice cancelled echo canceller adaptation and direct adaptation. These will be discussed in turn.

Figure 12:
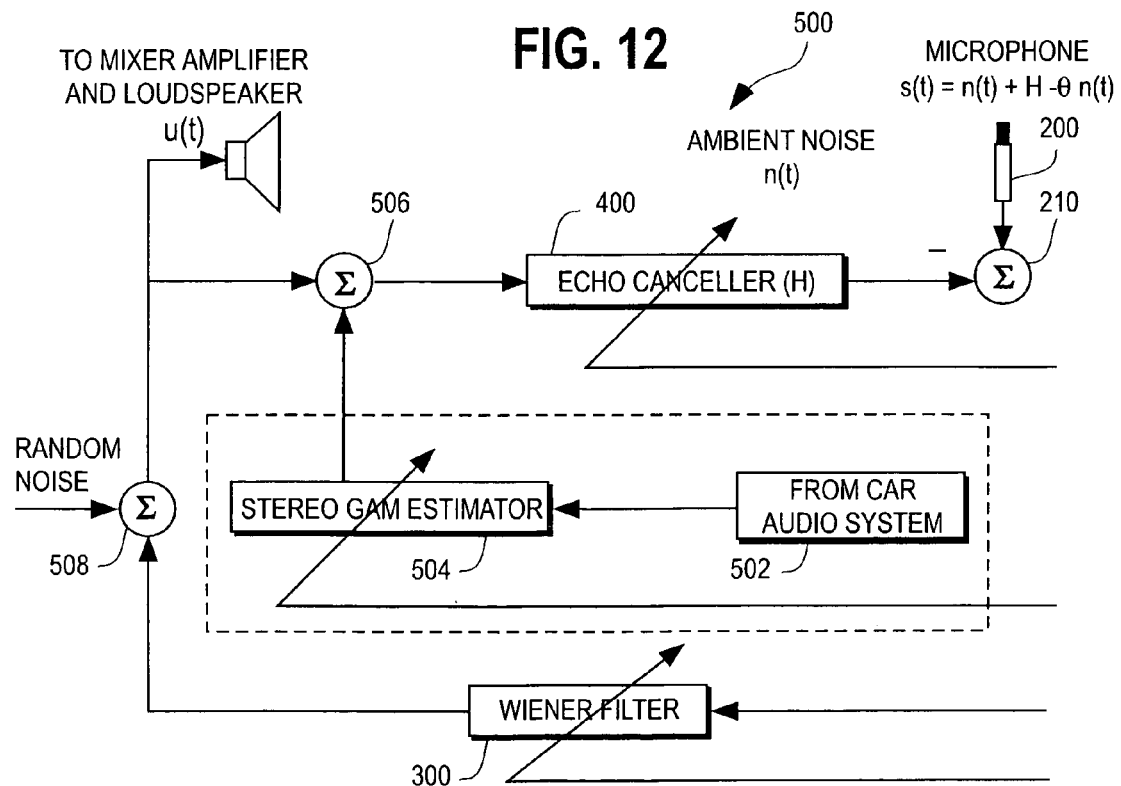
FIG. 12 is a block diagram of a single input-single output CCS with radio cancellation.

The first step, however, is to cancel the signal from the car stereo system, since the radio signal can be directly measured. The only unknown is the gain, but this can be estimated using any estimator, such as a conventional single tap LMS. FIG. 12 illustrates the single input-single output CCS with radio cancellation. In this development, the CCS 500 includes a microphone 200 with the input signal s(t)=n(t)+Hu(t), SEF Wiener filter 300 and AEC 400. The CCS 500 also includes an input 502 from the car audio system feeding a stereo gain estimator 504. The output of the gain estimator 504 is fed to a first summer 506. Another input to first summer 506 is the output of a second summer 508, which sums the output of the SEF 300 and random noise r(t). The output of the second summer 508 is also the signal u(t) fed to the loudspeaker.

As indicated in FIG. 12, the random noise is input at summer 508 to provide a known source of uncorrelated noise. This random noise r(t) is used as a direct means of insuring temporal independence, rather than parameterizing the input/output equations to account for dependencies and then estimate those parameters. The parameterization strategy has been found to be riddled with complexity, and the solution involves solving non-convex optimization problems. Accordingly, the parameterization approach is currently considered infeasible on account of the strict constraints and the computational cost.

As indicated in FIGS. 3 and 12, and implicitly in FIG. 11, a random noise is input to a summer 508 to be added to the loudspeaker output and input to the AEC 400. The inclusion of speech signals from SEF 300 in the AEC 400 via summer 508 may result in biased estimates of the acoustic transfer functions, since speech has relatively long time correlations. If this bias is significant, the random noise may be advantageouly input directly to the AEC 400 without including speech components from SEF 300 via summer 508 in the AEC 400 input. A further complication of acoustic transfer function estimation is that there will necessarily be unmodeled portions of the acoustic transfer function since the AEC 400 has finite length. However, it has been shown that the AEC coefficients will converge to the correct values for the portion of the transfer function that is modeled.

Advantageously, the random noise r(t) is entered as a dither signal. A random dither is independent of both noise and speech. Moreover, since it is spectrally white, it is removed, or blocked, by the Wiener SEF 300. As a result, identification of the system can now be performed based on the dither signal, since the system looks like it is running open loop. However, the dither signal must be sufficiently small so that it does not introduce objectionable noise into the acoustic environment, but at the same time it must be loud enough to provide a sufficiently exciting, persistent signal. Therefore, it is important that the dither signal be scaled with the velocity of the cabin, since the noise similarly increases. Advantageously, the dither volume is adjusted by the same automatic volume control used to modify the CCS volume control.

In the embodiment discussed above, an LMS algorithm is used to identify the acoustic transfer function. In addition to LMS, other possible approaches are a recursive least squares (RLS) algorithm and a weighted RLS. However, these other approaches require more computation, may converge faster (which is not required) and may not track changes as well as the LMS algorithm. Alternatively, it is possible to develop an iterative algorithm that identifies coefficients that must be causally related due to the acoustic delay, and the remaining coefficients are then identified recursively.

To derive this algorithm, it is first noted that the speaker output u(t) can be written as:

$$u[t] = z^{-d}(SEF^*(s[t] + n[t])) + r[t] \qquad (13)$$

Here SEF is the speech extraction filter 300 and d accounts for time delays.

Further, the dither signal r(t) is taken to be white, and therefore is uncorrelated with past values. Therefore, the input/output equations can be rearranged as follows:

$$\begin{aligned} y[t] &= \Pi_d H * u[t] + (I - \Pi_d) H * u[t] + s[t] + n[t] \qquad (14) \\ &= \Pi_d H * r[t] + (I - \Pi_d) H * (z^{-d}(SEF * (s[t] + \\ &\quad n[t])) + r[t]) + s[t] + n[t] \\ &= H * r[t] + (I - \Pi_d) H * (z^{-d}(SEF * (s[t] + n[t])) + \\ &\quad r[t]) + s[t] + n[t] \end{aligned}$$

Here $\Pi_d$ is a truncation operator that extracts the d impulse response coefficients and sets the others to zero, and d is less than the filter delay plus the computational delay plus the acoustic delay, i.e.:

$$d < t_{SEF} + t_{Computation} + t_{Acoustics} \qquad (15)$$

The last three terms in Equation 14 are uncorrelated from the first term, which is the required feature. It should also be noted that only the first d coefficients can be identified. This point serves as an insight as to the situations where integration of identification and control results in complications. As may be seen, this happens whenever d does not meet the "less than" criterion of Equation 15.

Next, the last three terms are regarded as noise, and either an LMS or RLS approach is applied to obtain very good estimates of the first d impulse coefficients of H. The coefficients from d+1 onwards can either be processed in a block format (d+1:2d−1, 2d:3d−1, . . . ) to improve computational cost and accuracy, or else they can be processed all at once. In either case, the equations are modified in both LMS and RLS to account for the better estimates of the first d coefficients of H. In the case of unnormalized LMS, the result is as follows:

$$H^{2d}_{t+1} = H^{2d}_t + \mu u^{2d}_{t-d}(y[t] - (u^d_t)H^d_{t+1} - (u^{2d}_{t-d})H^{2d}_t) \quad (16)$$

Here $H^{2d}_{t+1}$ denotes the update at time t+1. $H^{2d}_{t+1}$ is a column vector of the acoustic transfer function H containing the coefficients from d to 2d−1. In the case of input, $u^d_t$ denotes a column vector [u[t], u[t−1], . . . , u[t−d+1]]'. $H^{3d}_{t+1}$ is estimated in a similar manner, with the only difference being that the contribution from $H^{2d}_{t+1}$ is also subtracted from the error. Such algorithms can be guaranteed to have the same properties as their original counterparts.

It has been found that d is advantageously between 10 and 40. These values take into account the time delay between the speaker speaking and the sound appearing back at the microphone after having been passed through the CCS. As a result, this keeps the voice signals uncorrelated. In general, d should be as large as possible provided that it still meets the requirement of Equation 15.

In the case of RLS, it is also possible to develop a computationally efficient algorithm by adopting block processing. It takes approximately $O(n^2)$ in computational cost to process RLS where n is the length of the transfer function H. Block processing, on the other hand, only requires $O(nd^2)$. The algorithm is presented in FIG. 13.

As noted above, temperature is one of the principle components that contribute towards time variation in the AEC 400. Changes in temperature result in changing the speed of sound, which in turn has the effect of scaling the time axis or equivalently, in the frequency domain, linearly phase shifting the acoustic transfer function. Thus, if the temperature inside the cabin and the acoustic transfer function at a reference temperature are known, it is possible to derive the modified transfer function either in time, by decimating and interpolating, or in the frequency domain, by phase warping. It therefore is advantageous to estimate the temperature. This may be done by generating a tone at an extremely low frequency that falls within the loudspeaker and microphone bandwidths and yet is not audible. The equation for compensation is then:

$$\frac{c_1}{c_{ref}} = \arctan\left\{\frac{H_{ref}(\omega)}{H_1(\omega)}\right\} \quad (17)$$

Here c is the speed of sound.

Figure 14:
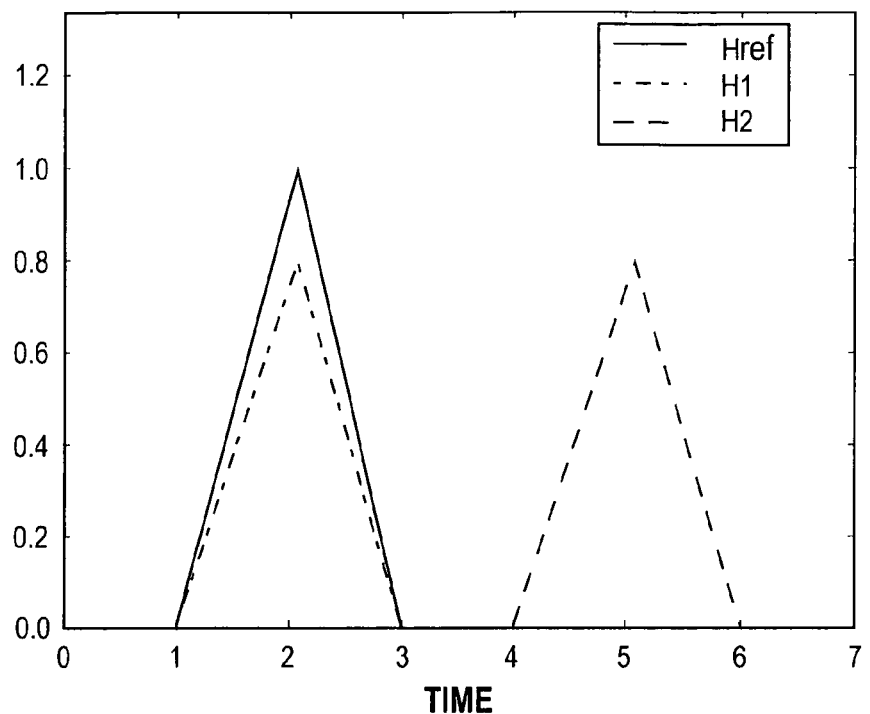
FIG. 14 is an illustration of the relative contribution of errors in temperature compensation.

The transfer function at a frequency ω can be estimated using any of several well known techniques. Sudden temperature changes can occur on turning on the air conditioning, heater or opening a window or door. It may be necessary to use the temperature estimate in addition to on-line identification because the error between two non-overlapping signals is typically larger than for overlapping signals, as shown in FIG. 14. Therefore, it may take a prohibitively large time to converge based just upon the on-line identification.

To accurately compute the speed of sound, it is necessary to compensate for any fixed time delays in the measured transfer functions H. For instance, there typically are fixed computational delays as well as delays as a function of frequency through any analog filter. These delays may be measured by use of multiple tones or a broadband signal.

As previously indicated, the effect of the CCS incorporating the SEF 300 and the AEC 400 on a typical noisy speech signal taken in a mini-van traveling at approximately 65 mph is shown in FIGS. 8 and 9. FIG. 8 illustrates the noisy speech signal and FIG. 9 illustrates the corresponding Wiener-filtered speech signal, both for the period of 12 seconds. A comparison of the two plots demonstrates substantial noise attenuation.

Also tested was a MATLAB implementation of the algorithm in which the Wiener filter sample window has been increased to 128 points while keeping the buffer block length at 32. This results in an overlap of 96 samples. The resulting noise cancellation performance is better. Moreover, by the use of conventional highly optimized real-to-complex and complex-to-real transforms, the computational requirements are approximately the same as for the smaller sample window.

As also previously indicated, the corresponding noise power spectral densities are shown in FIG. 7. These correspond to the periods of time in the 12 second interval above when there was no speech. The three curves respectively correspond to the power spectral density of the noisy signal, the mel-smoothed signal and the residual noise left in the de-noised signal. It is clear from FIG. 7 that mel-smoothing results in substantial noise reduction at high frequencies. Also, it can be seen that the residual noise in the Wiener filtered signal is of the order of 15 dB below the noise-only part of the noise plus speech signal uniformly across all frequencies.

Figure 15:
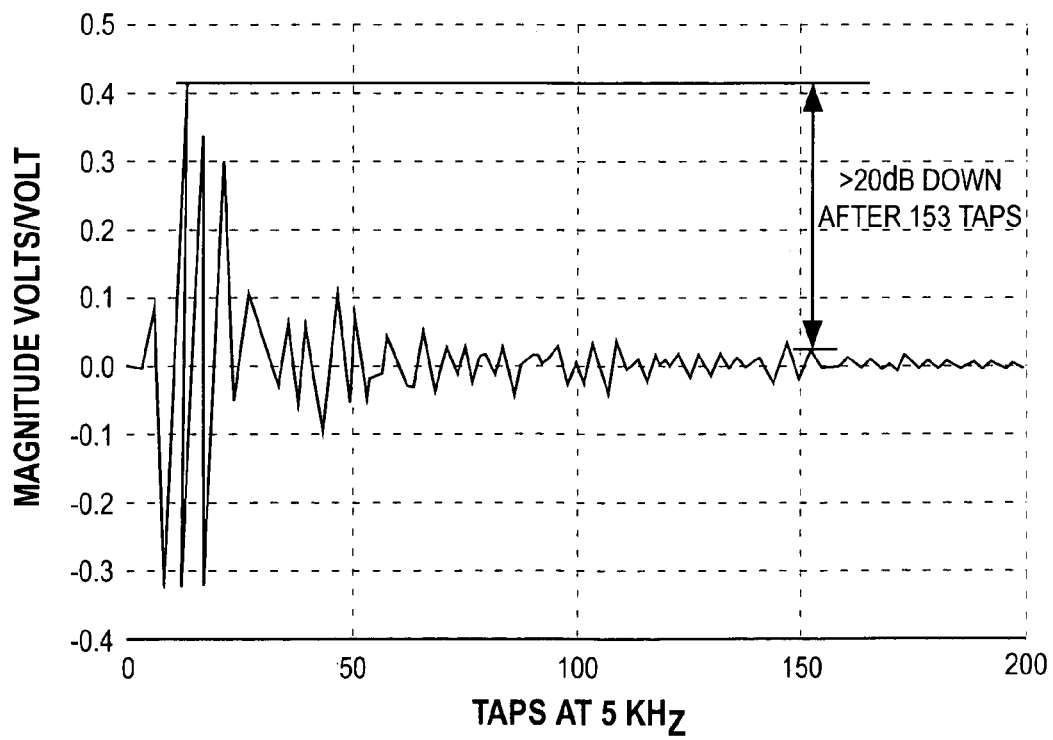
FIG. 15 is a first plot of the transfer function from a right rear loudspeaker to a right rear microphone using the AEC of the invention.
Figure 16:
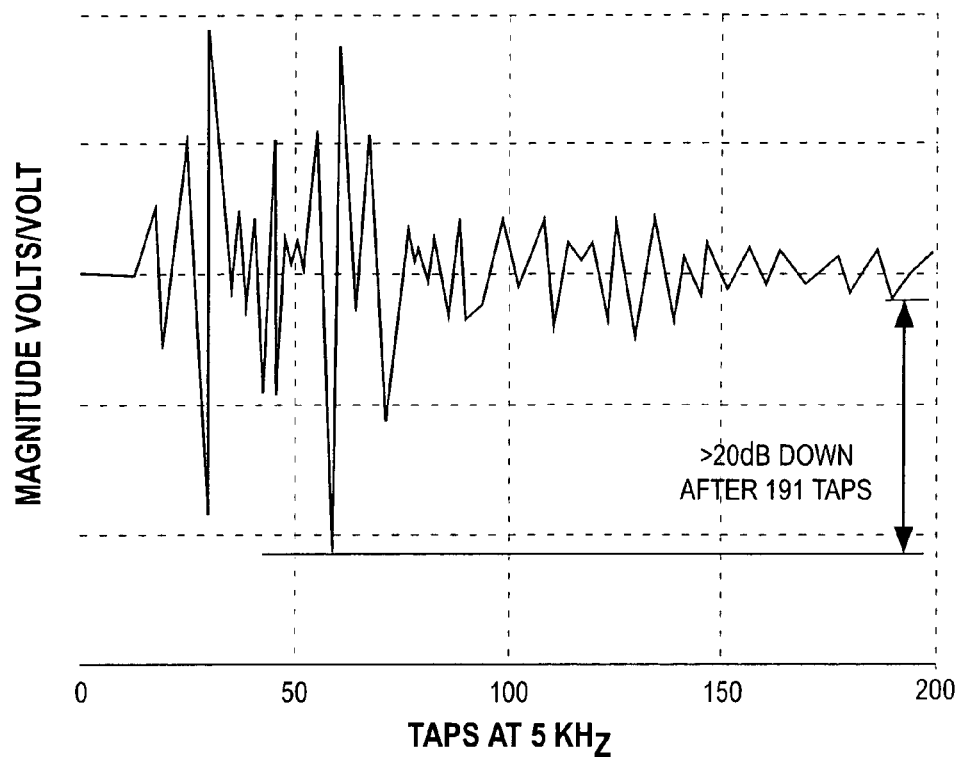
FIG. 16 is a second plot of the transfer function from a right rear loudspeaker to a right rear microphone using the AEC of the invention.

In the actual test of the CCS incorporating the advantageous SEF 300 and AEC 400 as shown in FIG. 10, the AEC 400 achieved more than 20 dB of cancellation. This is further shown in FIGS. 15 and 16. Therefore it was determined that the CCS performance met or exceeded all microphone independence, echo cancellation and noise reduction specifications.

There are other aspects of the present invention that contribute to the improved functioning of the CCS. One such aspect relates to an improved AGC in accordance with the present invention that is particularly appropriate in a CCS incorporating the SEF 300 and AEC 400. The present invention provides a novel and unobvious AGC circuit that controls amplification volume and related functions in the CCS, including the generation of appropriate gain control signals and the prevention of amplification of undesirable transient signals.

It is well known that it is necessary for customer comfort, convenience and safety to automatically control the volume of amplification of certain audio signals in audio communication systems such as the CCS. Such volume control should have an automatic component, although a user's manual control component is also desirable. The prior art recognizes that any microphone in a cabin will detect not only the ambient noise, but also sounds purposefully introduced into the cabin. Such sounds include, for example, sounds from the entertainment system (radio, CD player or even movie soundtracks) and passengers' speech. These sounds interfere with the microphone's receiving just a noise signal for accurate noise estimation.

Prior art AGC systems failed to deal with these additional sounds adequately. In particular, prior art AGC systems would either ignore these sounds or attempt to compensate for the sounds.

In contrast, the present invention provides an advantageous way to supply a noise signal to be used by the AGC system that has had these additional noises eliminated therefrom, i.e. by the use of the inventive SEF 300 and/or the inventive AEC 400. Advantageously, both the SEF 300 and the AEC 400 are used in combination with the AGC in accordance with the present invention, although the use of either inventive system will improve performance, even with an otherwise conventional AGC system. In addition, it will be recalled from the discussion of the SEF 300 that it is advantageous for the dither volume to be adjusted by the same automatic volume control used to modify the CCS volume control, and the present invention provides such a feature.

Figure 17:
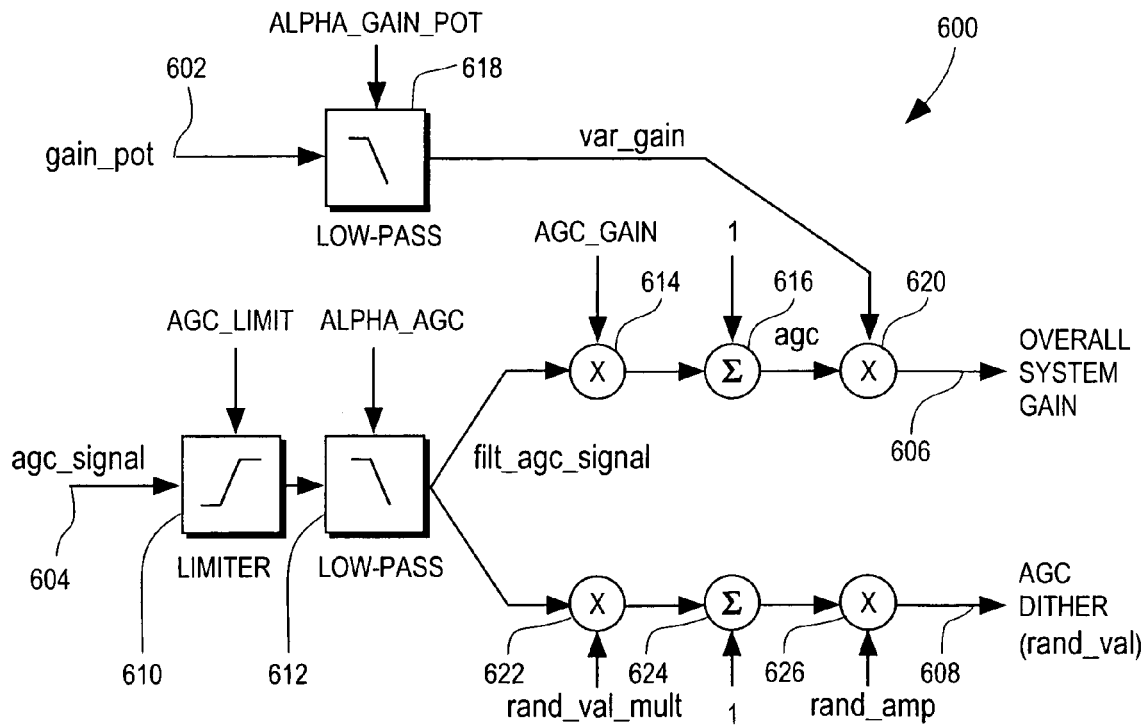
FIG. 17 is a schematic diagram of a first embodiment of the automatic gain control in accordance with the present invention.

The advantageous AGC 600 of the present invention is illustrated in FIG. 17. As shown therein, the AGC 600 receives two input signals: a signal gain-pot 602, which is an input from a user's volume control 920 (discussed below), and a signal agc-signal 604, which is a signal from the vehicle control system that is proportional to the vehicle speed. As will be discussed below, the generation of the agc-signal 604 represents a further aspect of the present invention. The AGC 600 further provides two output signals: an overall system gain 606, which is used to control the volume of the loudspeakers and possibly other components of the audio communication system generally, and an AGC dither gain control signal, rand-val 608, which is available for use as a gain control signal for the random dither signal r(t) of FIG. 9, or equivalently for the random noise signals $rand_1$ and $rand_2$ of FIG. 3.

Figure 1:
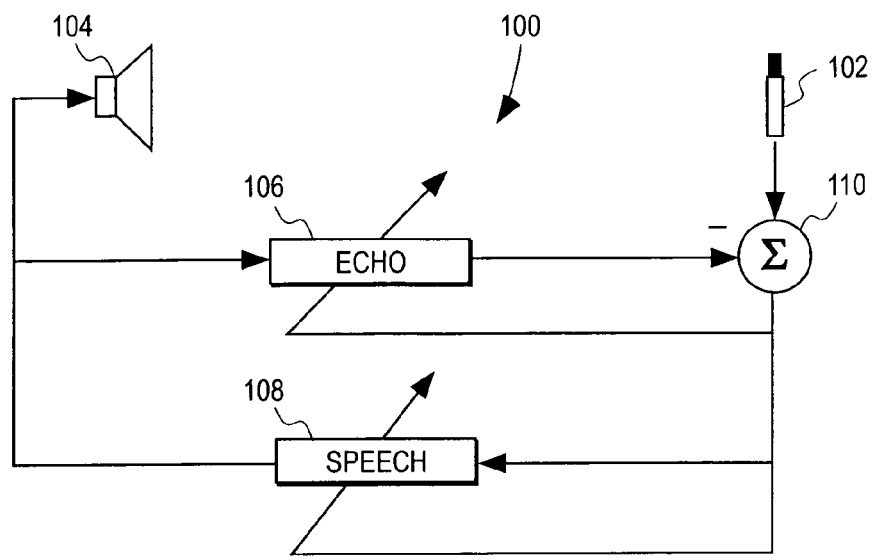
FIG. 1 is a simplified block diagram of a conventional cabin communication system.
Figure 18:
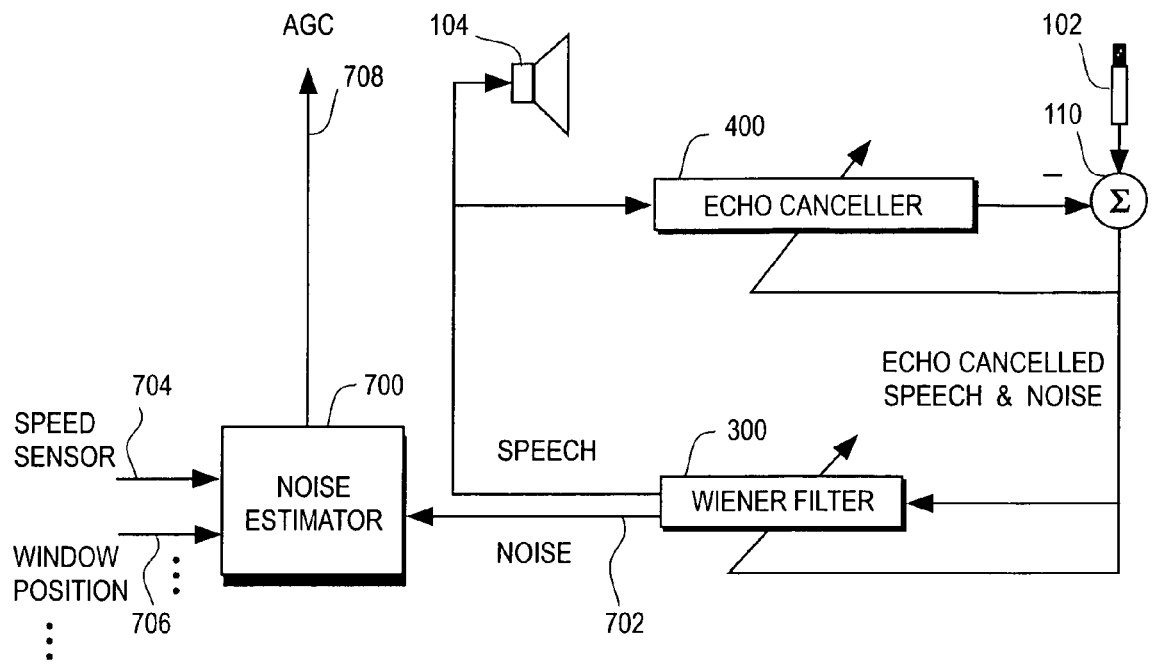
FIG. 18 illustrates an embodiment of a device for generating a first advantageous AGC signal.

Before discussing the inventive structure of AGC 600 itself, a discussion will be provided of the generation of the inventive agc-signal 604. FIG. 18 is similar to FIG. 1, but shows the use of the SEF 300 and the AEC 400, as well as the addition of a noise estimator 700 that generates the agc-signal 604. As shown in FIG. 18, the agc-signal 604 is generated in noise estimator 700 from a noise output of the SEF 300. As described above in connection with FIG. 6, the primary output signal output from filter $F_0$ 312 is the speech signal from which all noise has been eliminated. However, the calculation of this speech signal involved the determination of the current noise estimate, output from the causal filter 310. This current noise estimate is illustrated as noise 702 in FIG. 18.

It is possible to use this noise 702 as the agc-signal 604 itself. This noise 702 is an improvement for this purpose over noise estimates in prior art systems in that it reflects the superior noise estimation of the SEF 300, with the speech effectively removed. It further reflects the advantageous operation of the AEC 400 that removed the sound introduced into the acoustic environment by the loudspeaker 104. Indeed, it would even be an improvement over the prior art to use the output of the AEC 400 as the agc-signal 604. However, this output includes speech content, which might bias the estimate, and therefore is generally not as good for this purpose as the noise 702.

However, the present invention goes beyond the improved noise estimation that would occur if the noise 702 were used for the agc-signal 604 by combining the noise 702, which is a feedback signal, with one or more feed forward signals that directly correspond to the amount of noise in the cabin that is not a function of the passengers' speech. As shown in FIG. 18, such feed forward signals advantageously include a speed signal 704 from a speed sensor (not illustrated) and/or a window position signal 706 from a window position sensor (not illustrated). As anyone who has ridden in an automobile will know, the faster the automobile is going, the greater the engine and other road noise, while the interior noise also increases as one or more windows are opened. By combining the use of these feed forward signals with the noise 702, a superior agc-signal 604 can be generated as the output 708 of noise estimator 700. The superior AGC signal may actually decrease the system gain with increasing noise under certain conditions such as wind noise so loud that comfortable volume levels are not possible.

Referring back to FIG. 17, the agc-signal 604 is considered to be the desired one of the noise 702 and the output 708. However, because the structure of the AGC 600 is itself novel and unobvious and constitutes an aspect of the present invention, it is possible to alternatively use a more conventional signal, such as the speed signal 704 itself.

In each case, the agc-signal 604 is then processed, advantageously in combination with the output of the user's volume control gain-pot 602, to generate the two output signals 606, 608. In this processing, a number of variables are assigned values to provide the output signals 606, 608. The choices of these assigned values contribute to the effective processing and are generally made based upon the hardware used and the associated electrical noise, as well as in accordance with theoretical factors. However, while the advantageous choices for the assigned values for the tested system are set forth below, it will be understood by those of ordinary skill in the art that the particular choices for other systems will similarly depend on the particular construction and operation of those systems, as well as any other factors that a designer might wish to incorporate. Therefore, the present invention is not limited to these choices.

The agc-signal 604 is, by its very nature, noisy. Therefore, it is first limited between 0 and a value AGC-LIMIT in a limiter 610. A suitable value for AGC-LIMIT is 0.8 on a scale of zero to one. Then the signal is filtered with a one-pole low-pass digital filter 612 controlled by a value ALPHA-AGC. The response of this filter should be fast enough to track vehicle speed changes, but slow enough that the variation of the filtered signal does not introduce noise by amplitude modulation. A suitable value for ALPHA-AGC is 0.0001. The output of the filter 612 is the filt-agc-signal, and is used both to modify the overall system gain and to provide automatic gain control for the dither signal, as discussed above.

Turning first to the overall system gain calculation, the filt-agc-signal is used to linearly increase this gain. This linear function has a slope of AGC-GAIN, applied by multiplier 614, and a y-intercept of 1, applied by summer 616. A suitable value for AGC-GAIN is 0.8. The result is a signal agc, which advantageously multiplies a component from the user's volume control.

This component is formed by filtering the signal gain-pot 602 from the user's volume control. Like agc-signal 604, gain-pot 602 is very noisy and therefore is filtered in low-pass filter 618 under the control of variable ALPHA-GAIN-POT. A suitable value for ALPHA-GAIN-POT is 0.0004. The filtered output is stored in the variable var-gain. The overall front to rear gain is the product of the variable var-gain and the variable gain-r (not shown). A suitable value for gain-r is 3.0. Similarly, the overall rear to front gain (not shown) is the product of the variable var-gain and a variable gain-f, also having a suitable value of 3.0 in consideration of power amplifier balance.

In AGC 600, however, the overall system gain 606 is formed by multiplying, in multiplier 620, the var-gain output from filter 618 by the signal agc output from the summer 616.

The gain control signal rand-val 608 for the dither signal is similarly processed, in that the filt-agc-signal is used to linearly increase this gain. This linear function has a slope of fand-val-mult, applied by multiplier 622, and a y-intercept of 1, applied by summer 624. A suitable value for rand-val-mult is 45. The output of summer 624 is multiplied by variable rand-amp, a suitable value of which is 0.0001. The result is the signal rand-val 608.

The AGC 600 is tuned by setting appropriate values for AGC-LIMIT and ALPHA-AGC based on the analog AGC hardware and the electrical noise. In the test system, the appropriate values are 0.5 and 0.0001, respectively.

Then the variable rand-val for the dither signal is further tuned by setting rand-amp and rand-val-mult. To this end, first rand-amp is set to the largest value that is imperceptible in system on/off under open loop, idle, windows and doors closed conditions. Next, the variable rand-val-mult is set to the largest value that is imperceptible in system on/off under open loop, cruise speed (e.g. 65 mph), windows and doors closed conditions. In the test system, this resulted in rand-amp equal to 0.0001 and rand-val-mult equal to 45, as indicated above.

In the test vehicle, the output 708 of FIG. 18 was identical to the signal-agc 604 output from the summer 616 in FIG. 17. This signal-agc was directly proportional to vehicle speed over a certain range of speeds, i.e. was linearly related over the range of interest. However, since road and wind noise often increase as a nonlinear function of speed, e.g. as a quadratic function, a more sophisticated generation of the signal-agc may be preferred.

Figure 19:
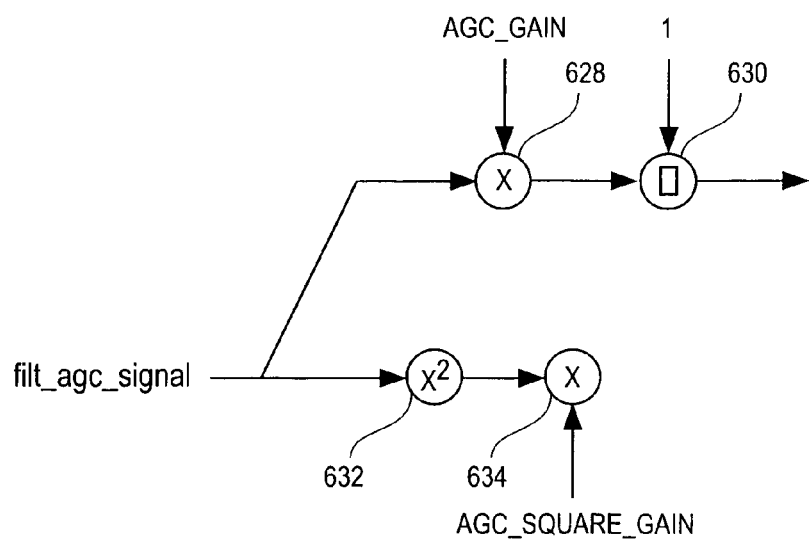
FIG. 19 illustrates an embodiment of a device for generating a second advantageous AGC signal.

FIG. 19 illustrates the generation of the signal-agc by a quadratic function. The filt-agc-signal from low pass filter 612 in FIG. 17 is multiplied in multiplier 628 by AGC-GAIN and added, in summer 630, to one. However, summer 630 also adds to these terms a filt-agc-signal squared term from square multiplier 632 which was multiplied by a constant AGC-SQUARE-GAIN in multiplier 634. This structure implements a preferred agc signal that is a quadratic function of the filt-agc-signal.

The interior noise of a vehicle cabin is influenced by ambient factors beyond the contributions from engine, wind and road noise discussed above that depend only on vehicle speed. For instance, wind noise varies depending on whether the windows are open or closed and engine noise varies depending on the RPM. The interior noise further depends on unpredictable factors such as rain and nearby traffic. Additional information is needed to compensate for these factors.

In addition to the Window Position and Speed Sensor inputs, noise estimator 700 of FIG. 18 may be modified to accept inputs such as Door Open and Engine RPM etc. for known factors that influence cabin interior noise levels. These additional inputs are used to generate the output 708.

In a preferred embodiment, the Door Open signal (e.g. one for each door) is used to reduce the AGC gain to zero, i.e. to turn the system off while a door is open. The Window Open signal (e.g. one for each window) are used to increase the AGC within a small range if, for example, one or more windows are slightly open, or to turn the system off if the windows are fully open. In many vehicles, the engine noise proportional to RPM is insignificant and AGC for this noise will not be needed. However, this may not be the case for certain vehicles such as Sport Utility Vehicles, and linear compensation such as depicted in FIG. 17 for the agc-signal may be appropriate.

Figure 20:
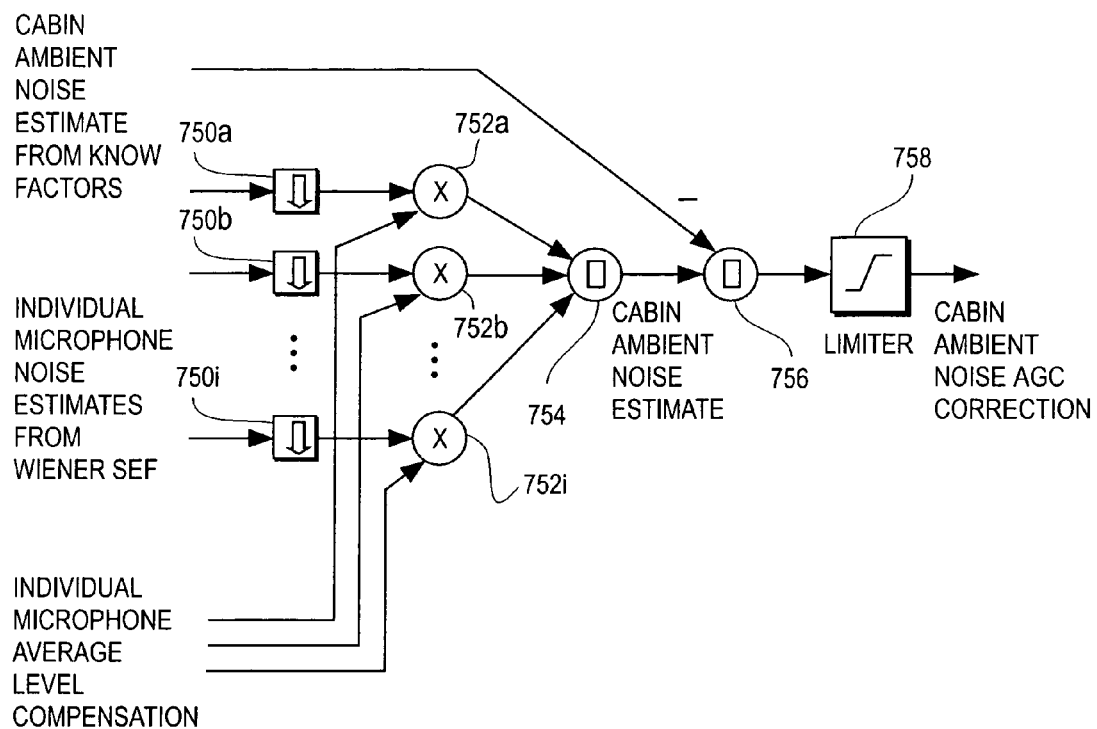
FIG. 20 is a schematic diagram of a second embodiment of the automatic gain control in accordance with the present invention.

FIG. 20 is an illustration of the uses of the input from the SEF 300 to account for unknown factors that influence cabin interior noise levels. As shown therein, the SEF 300 can operate for each microphone to enhance speech by estimating and subtracting the ambient noise, so that individual microphone noise estimates can be provided. The noise estimator accepts the instantaneous noise estimates for each microphone, integrates them in integrators 750a, 750b, ... 750i and weights them with respective individual microphone average levels compensation weights in multipliers 752a, 752b, ... 752i. The weights are preferably precomputed to compensate for individual microphone volume and local noise conditions, but the weights could be computed adaptively at the expense of additional computation. The weighted noise estimates are then added in adder 754 to calculate a cabin ambient noise estimate. The cabin ambient noise estimate is compared to the noise level estimated from known factors by subtraction in subtractor 756. If the cabin ambient noise estimate is greater, then after limiting in limiter 758, the difference is used as a correction in that the overall noise estimate is increased accordingly. While it is possible to use just the cabin ambient noise estimate for automatic gain control, the overall noise estimate has been found to be more accurate if known factors are used first and unknown factors are added as a correction, as in FIG. 20.

Another aspect of the AGC in accordance with the present invention contributes to the advantageous functioning of the CCS. Thus, it was noted above that the SEF 300 provides excellent noise removal in part by treating the noise as being of relatively long duration or continuous in time compared with the speech component. However, there are some noise elements that are of relatively short duration, comparable to the speech components, for example the sound of the mini-van's tire hitting a pothole. There is nothing to be gained by amplifying this type of noise along with the speech component. Indeed, such short noises are frequently significantly louder than any expected speech component and, if amplified, could startle the driver.

Such short noises are called transient noises, and the prior art includes many devices for specific transient signal suppression, such as lightning or voltage surge suppressors. Other prior art methods pertain to linear or logarithmic volume control (fade-in and fade-out) to control level-change transients. There are also numerous control systems which are designed to control the transient response of some physical plant, i.e. closed loop control systems. All these prior art devices and methods tend to be specific to certain implementations and fields of use.

A transient suppression system for use with the CCS in accordance with the present invention also has implementation specifics. It must first satisfy the requirement, discussed above, that all processing between detection by the microphones and output by the speakers must take no more than 20 ms. It must also operate under open loop conditions.

In accordance with a further aspect of the present invention, there are provided transient signal detection techniques consisting of parameter estimation and decision logic that are used to gracefully preclude the amplification or reproduction of undesirable signals in an intercommunication system such as the CCS.

In particular, the parameter estimation and decision logic includes comparing instantaneous measurements of the microphone or loudspeaker signals, and further includes comparing various processed time histories of those signals to thresholds or templates. When an undesirable signal is so detected, the system shuts off adaptation for a suitable length of time corresponding to the duration of the transient and the associated cabin ring-down time and the system outputs (e.g. the outputs of the loudspeakers) are gracefully and rapidly faded out. After the end of this time, the system resets itself, including especially any adaptive parameters, and gracefully and rapidly restores the system outputs. The graceful, rapid fade-out and fade-in is accomplished by any suitable smooth transition, e.g. by an exponential or trigonometric function, of the signal envelope from its current value to zero, or vice versa.

In accordance with the present invention, the parameter estimation advantageously takes the form of setting thresholds and/or establishing templates. Thus, one threshold might represent the maximum decibel level for any speech component that might reasonably be expected in the cabin. This parameter might be used to identify any speech component exceeding this decibel level as an undesirable transient.

Similarly, a group of parameters might establish a template to identify a particular sound. For example, the sound of the wheel hitting a pothole might be characterized by a certain duration, a certain band of frequencies and a certain amplitude envelope. If these characteristics can be adequately described by a reasonable number of parameters to permit the identification of the sound by comparison with the parameters within the allowable processing time, then the group of parameters can be used as a template to identify the sound. While thresholds and templates are mentioned as specific examples, it will be apparent to those of ordinary skill in the art that many other methods could be used instead of, or in addition to, these methods.

Figure 21:
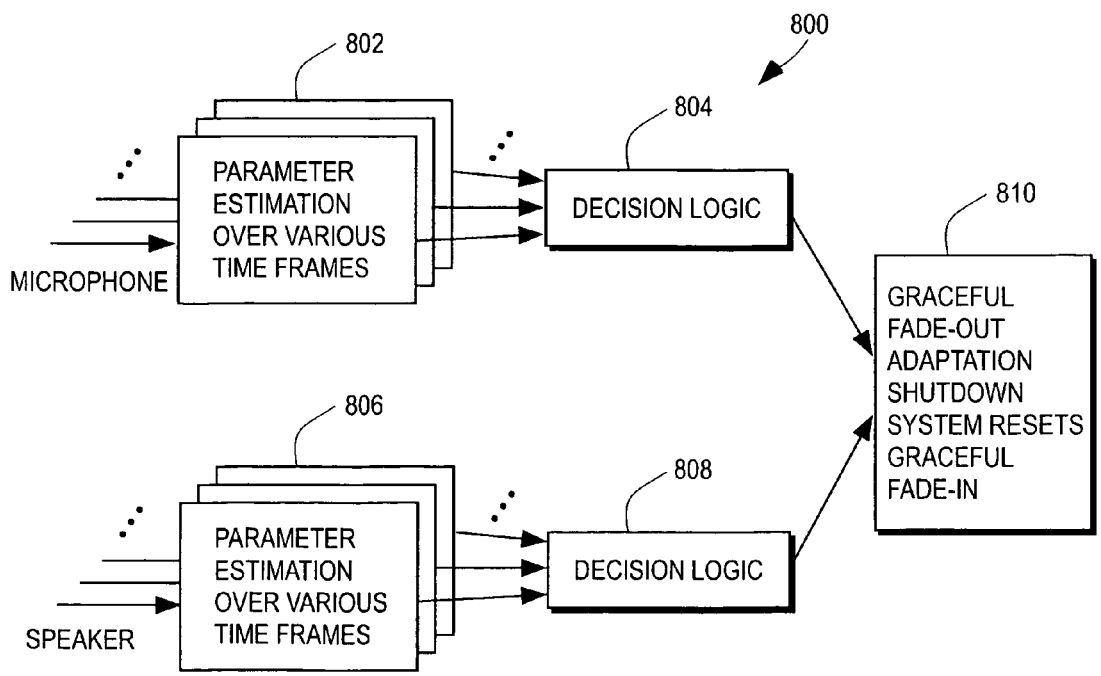
FIG. 21 is a schematic diagram illustrating a transient processing system in accordance with the present invention.

FIG. 21 illustrates the overall operation of the transient processing system 800 in accordance with the present invention. As shown in FIG. 21, signals from the microphones in the cabin are provided to a parameter estimation processor 802. It will be recalled that the outputs of the loudspeakers will reflect the content of the sounds picked up by the microphones to the extent that those sounds are not eliminated by the processing of the CCS, e.g. by noise removal in the SEF and by echo cancellation by the AEC 400. Based on these signals, the processor 802 determines parameters for deciding whether or not a particular short-duration signal is a speech signal, to be handled by processing in the SEF 300, or an undesirable transient noise to be handled by fading-out the loudspeaker outputs. Such parameters may be determined either from a single sampling of the microphone signals at one time, or may be the result of processing together several samples taken over various lengths of times. One or more such parameters, for example a parameter based on a single sample and another parameter based on 5 samples, may be determined to be used separately or together to decide if a particular sound is an undesirable transient or not. The parameters may be updated continuously, at set time intervals, or in response to set or variable conditions.

The current parameters from processor 802 are then supplied to decision logic 804, which applies these parameters to actually decide whether a sound is the undesirable transient or not. For example, if one parameter is a maximum decibel level for a sound, the decision logic 804 can decide that the sound is an undesirable transient if the sound exceeds the threshold. Correspondingly, if a plurality of parameters define a template, the decision logic 804 can decide that the sound is an undesirable transient if the sound matches the template to the extent required.

If the decision logic 804 determines that a sound is an undesirable transient, then it sends a signal to activate the AGC, here illustrated as automatic gain control (AGC) 810, which operates on the loudspeaker output first to achieve a graceful fade-out and then, after a suitable time to allow the transient to end and the cabin to ring down, provide a graceful fade-in.

Once again, the decision in decision logic 804 can be based upon a single sample of the sound, or can be based upon plural samples of the sound taken in combination to define a time history of the sound. Then the time history of the sound may be compared to the thresholds or templates established by the parameters. Such time history comparisons may include differential (spike) techniques, integral (energy) techniques, frequency domain techniques and time-frequency techniques, as well as any others suitable for this purpose.

As shown in FIG. 21, the identification of a sound as an undesirable transient may additionally or alternatively be based on the loudspeaker signals. These loudspeaker signals would be provided to a parameter estimation processor 806 for the determination of parameters, and those parameters and the sound sample or time history of the sound would be provided to another decision logic 808. The structure of processor 806 would ordinarily be generally similar to, or identical to, the structure of processor 802, although different parameter estimations may be appropriate to take into account the specifics of the microphones or loudspeakers, for example. Similarly, the structure of the decision logic 808 would ordinarily be similar to, or identical to, that of the decision logic 804, although different values of the parameters might yield different thresholds and/or templates, or even separate thresholds and/or templates.

It will also be understood that other techniques for parameter estimation, decision logic and signal suppression may be used within the scope of the present invention. Similarly, the invention is not limited to the use of microphone signals and/or loudspeaker signals, nor need each decision logic operate on only one kind of such signals. Furthermore, the response to the detection of an undesirable transient is not limited to fade-out.

Figure 22:
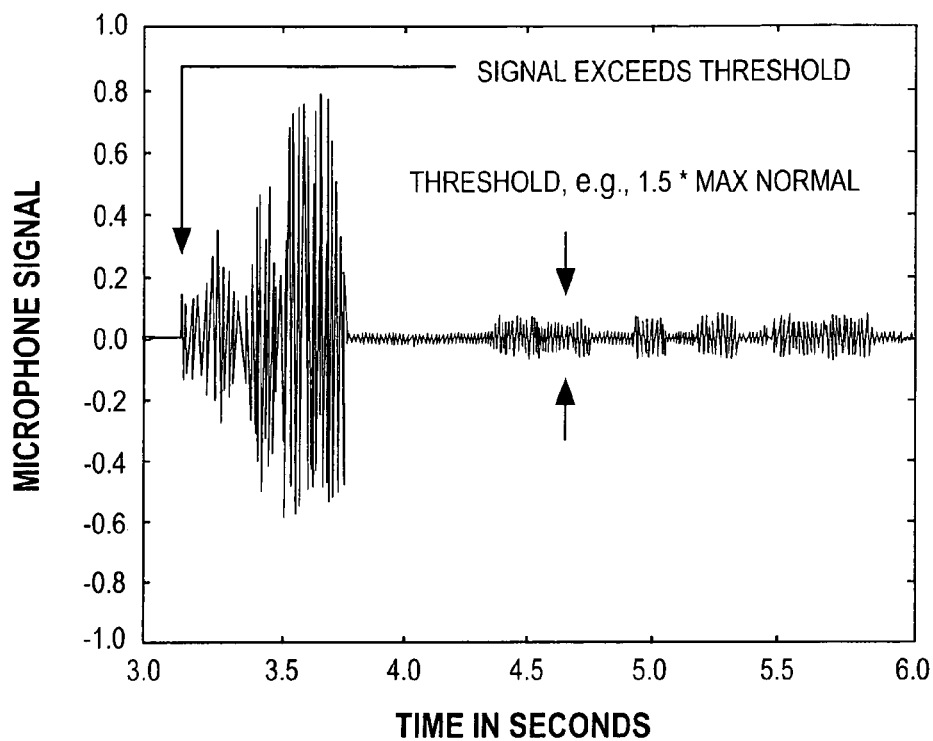
FIG. 22 illustrates the determination of a simple threshold.

The determination of a simple threshold is shown in FIG. 22. For this determination, a recording is made of the loudest voice signals for normal conversation. FIG. 22 shows the microphone signals for such a recording. This example signal consists of a loud, undesirable noise followed by a loud, acceptable spoken voice. A threshold is chosen such that the loudest voice falls below the threshold and the undesirable noise rapidly exceeds the threshold. The threshold level may be chosen empirically, as in the example at 1.5 times the maximum level of speech, or it may by determined statistically to balance incorrect AGC activation against missed activation for undesirable noise.

Figure 23:
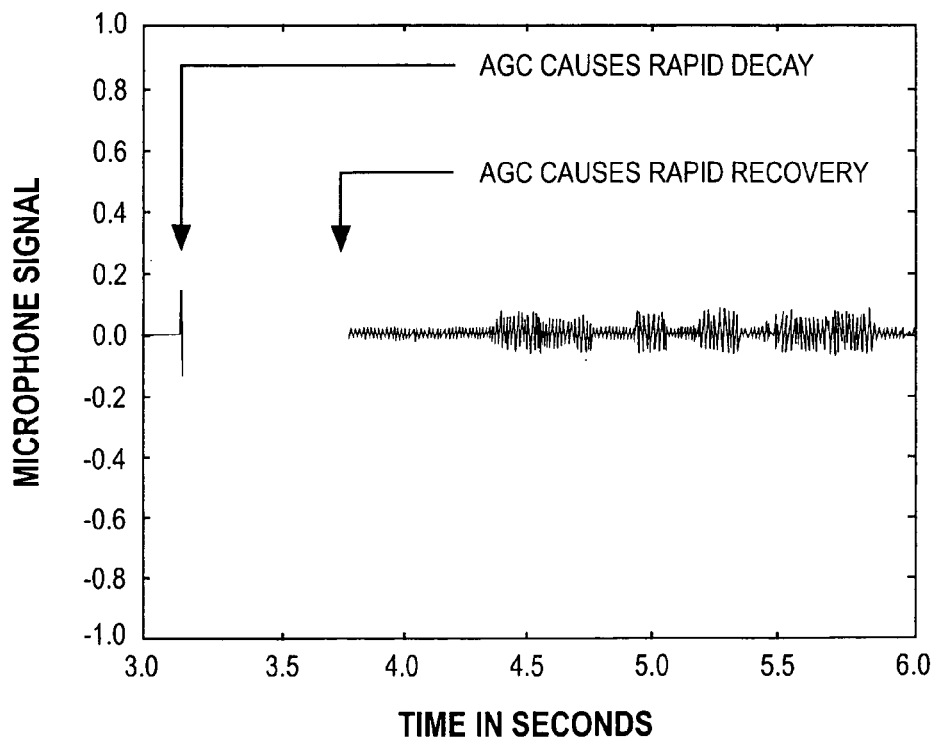
FIG. 23 illustrates the behavior of the automatic gain control for the signal and threshold of FIG. 22.
Figure 24:
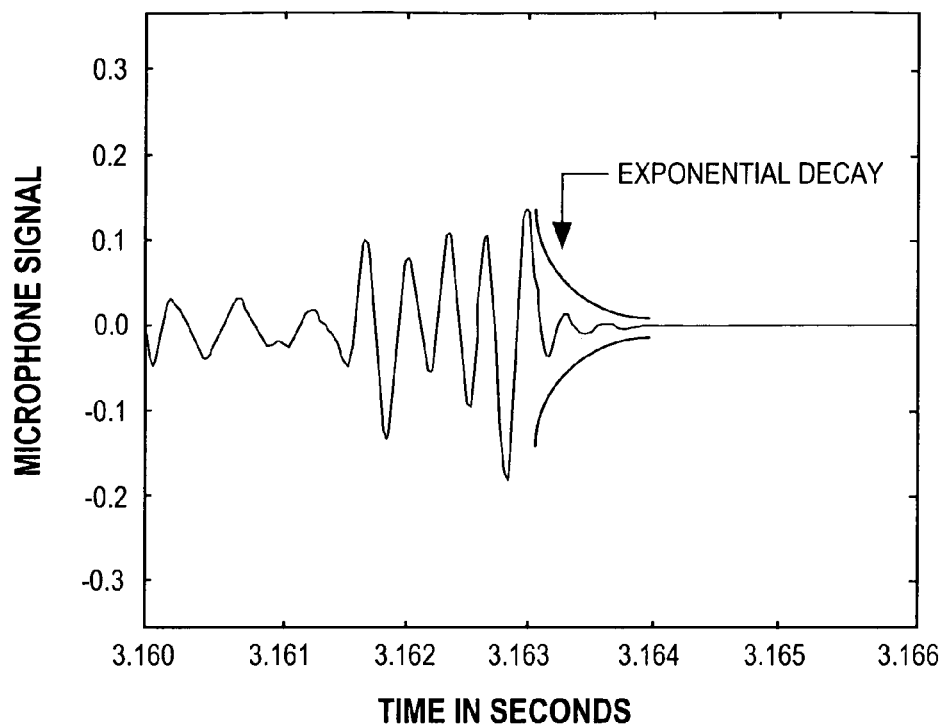
FIG. 24 is a detail of FIG. 24 illustrating the graceful fade-out.

The behavior for the AGC for the signal and threshold of FIG. 22 is shown in FIG. 23. The undesirable noise rapidly exceeds the threshold and is eliminated by the AGC. A detail of the AGC graceful shutdown from FIG. 23 is shown in FIG. 24, wherein the microphone signal is multiplied by a factor at each successive sample to cause an exponential decay of the signal output from the AGC.

Another example of a threshold is provided by comparing the absolute difference between two successive samples of a microphone signal to a fixed number. Since the microphone signal is bandlimited, the maximum that the signal can change between successive samples is limited. For example, suppose that the sample rate is 10 KHz and the microphone is $4^{th}$ order Butterworth bandpass limited between 300 Hz and 3 KHz. The maximum the bandpassed signal can change is approximately 43% of the largest acceptable step change input to the bandpass filter. A difference between successive samples that exceeds a threshold of 0.43 should activate the AGC. This threshold may also be determined empirically, since normal voice signals rarely contain maximum allowable amplitude step changes.

Figure 25:
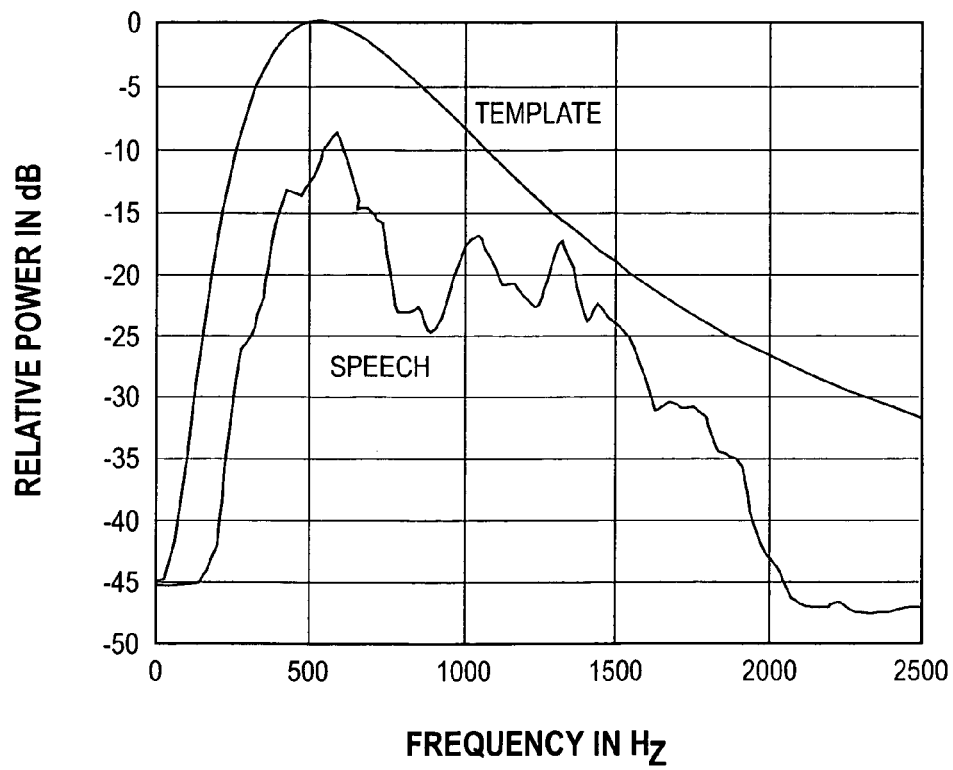
FIG. 25 illustrates the determination of a simple template.

The determination of a simple template is shown in FIG. 25. The loudspeaker signal containing speech exhibits a characteristic power spectrum, as seen in the lower curve in FIG. 25. The power spectrum is determined from a short time history of the loudspeaker signal via a Fast Fourier Transform (FFT), a technique well known in the art. The template in this example is determined as a Lognormal distribution that exceeds the maximum of the speech power spectrum by approximately 8 dB. In operation, the power spectrum of short time histories of data is compared to the template. Any excess causes activation of the AGC. The template in this example causes AGC activation for tonal noise or broadband noise particularly above about 1.8 KHz.

In the testing of the mini-van yielding the results of FIG. 10, a number of the parameters were assigned values to provide good transient detection and response. The choices of these assigned values contributed to the effective processing and were generally made based on the hardware used and the associated electrical noise, as well as in accordance with theoretical factors. However, while the advantageous choices for the assigned valued for the tested system are set forth below, it will be understood by those of ordinary skill in the art that the particular choices for other systems will similarly depend on the particular construction and operation of those systems, as well as any other factors that a designer might wish to incorporate. Therefore the present invention is not limited to these choices.

Thus, in the test system, a transient is detected when any microphone or loudspeaker voltage reaches init-mic-threshold or init-spkr-threshold, respectively. These thresholds were chosen to preclude saturation of the respective microphone or loudspeaker, since, if saturation occurs, the echo cancellation operation diverges (i.e. the relationship between the input and the output, as seen by the LMS algorithm, changes). The thresholds should be set to preclude any sounds above the maximum desired level of speech to be amplified. An advantageous value for both thresholds is 0.9.

When a transient is detected, the system shuts off adaptation for a selected number of samples at the sample rate $F_s$, which in the test system is 5 KHz. This is so that the SEF 300 and the AEC 400 will not adapt their operations to the transient. This number of samples is defined by a variable adapt-off-count, and should be long enough for the cabin to fully ring down. This ring down time is parameterized as TAPS, which is the length of time it takes for the mini-van to ring down when the sample rate is $F_s$. For an echo to decay 20 dB, this was found to be approximately 40 ms. TAPS increases linearly with $F_s$.

It should also be noted that TAPS represents the size of the Least Mean Squares filters LMS (see FIG. 3) that model the acoustics. These filters should be long enough that the largest transfer function has decayed to approximately 25 dB down from its maximum. Such long transfer functions have an inherently smaller magnitude due to the natural acoustic attenuation.

In the test system, it was found that a suitable value for TAPS was 200 and that a suitable value for adapt-off-count was 2*TAPS, i.e. 80 ms at $F_s$=5 KHz. The variable adapt-off-count is reset to 2*TAPS if multiple transients occur. At the end of a transient, the SEF 300 is also reset.

Finally, when the output is being shut off due to a transient (fade-out), a parameter OUTPUT-DECAY-RATE is used as a multiplier of the loudspeaker value each sample period. A suitable value is 0.8, which provides an exponential decay that avoids a "click" associated with abruptly setting the loudspeaker output to zero. A corresponding ramp-on at the end of the transient may also be provided for fade-in.

Thus, the advantageous AGC provides improved control to aid voice clarity and preclude the amplification of undesirable noises.

As mentioned above in connection with FIG. 17, an input from a user's manual volume control is used in performing the automatic gain control. A further aspect of the present invention is directed to an improved user interface installed in the cabin for improving the ease and flexibility of the CCS.

In particular, while the CCS is intended to incorporate sufficient automatic control to operate satisfactorily once the initial settings are made, it is of course desirable to incorporate various manual controls to be operated by the driver and passengers to customize its operation. In this aspect of the present invention, the user interface enables customized use of the plural microphones and loudspeakers. While the user interface of the present invention may be used with many different cabin communication systems, its use is enhanced through the superior processing of the CCS employing the SEF 300 and the AEC 400, wherein superior microphone independence, echo cancellation and noise elimination are provided.

As shown in FIG. 2, the CCS of the present invention provides plural microphones including, for example, one directed to pick up speech from the driver's seat and one each to pick up speech at each passenger seat. Similarly, the CCS may provide a respective loudspeaker for each of the driver's seat and the passengers' seats to provide an output directed to the person in the seat. Accordingly, since the sound pickup and the sound output can be directed without uncomfortable echos, it is possible, for example, for the driver to have a reasonably private conversation with a passenger in the rear left seat (or any other selected passenger or passengers) by muting all the microphones and loudspeakers other than the ones at the driver's seat and the rear left seat. The advantageous user interface of the present invention enables such an operation.

Other useful operations are also enabled by the advantageous user interface for facilitating communication. For example, the volumes of the various loudspeakers may be adjusted, or the pickup of a microphone may be reduced to give the occupant of the respective seat more privacy. Similarly, the pickup of one microphone might be supplied for output to only a selected one or more of the loudspeakers, while the pickup of another microphone might go to other loudspeakers. In a different type of operation, a recorder may be actuated from the various seats to record and play back a voice memo so that, for example, one passenger may record a draft of a memo at one time and the same or another passenger can play it back at another time to recall the contents or revise them. As another example, one or more of the cabin's occupants can participate in a hands-free telephone call without bothering the other occupants, or even several hands-free telephone calls can take place without interference.

Figure 26:
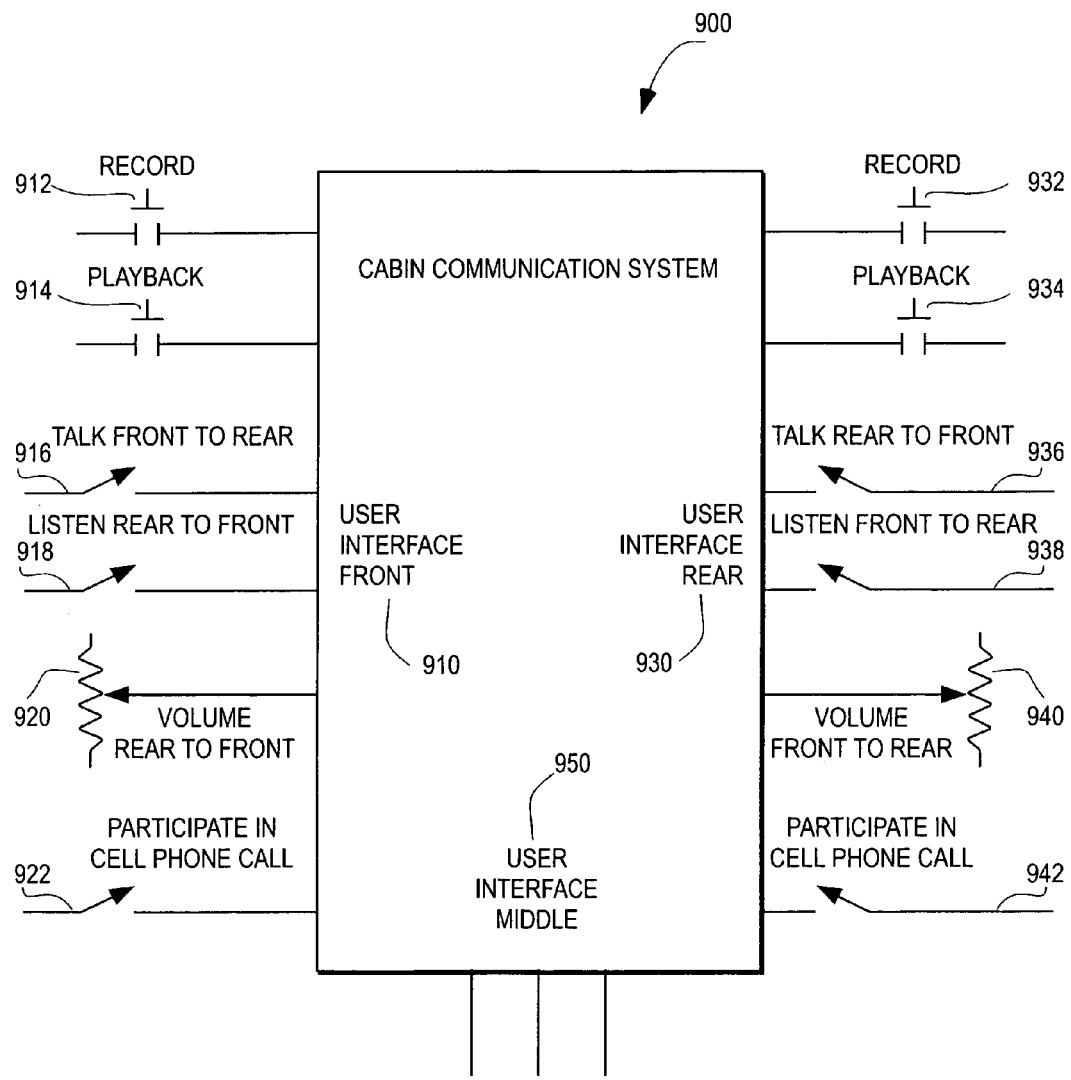
FIG. 26 is a schematic diagram of an embodiment of the user interface in accordance with the present invention.

FIG. 26 illustrates the overall structure of the user interface in accordance with the present invention. As shown therein, each position within the cabin can have its own subsidiary interface, with the subsidiary interfaces being connected to form the overall interface.

Thus, in FIG. 26, the overall interface 900 includes a front interface 910, a rear interface 930 and a middle interface 950. Depending on the size of the cabin and the number of seats, of course, more middle interfaces may be provided, or each of the front, middle and rear interfaces may be formed as respective left and right interfaces.

The front interface 910 includes a manual control 912 for recording a voice memo, a manual control 914 for playing back the voice memo, a manual control 916 for talking from the front of the cabin to the rear of the cabin, a manual control 918 for listening to a voice speaking from the rear to the front, a manual control 920 for controlling the volume from the rear to the front, and a manual control 922 for participating in a hands-free telephone call. Manual controls corresponding to controls 916, 918 and 920 (not shown) for communicating with the middle interface 950 are also provided.

The rear interface 930 correspondingly includes a manual control 932 for recording a voice memo, a manual control 934 for playing back the voice memo, a manual control 936 for talking from the rear of the cabin to the front of the cabin, a manual control 938 for listening to a voice speaking from the front to the rear, a manual control 940 for controlling the volume from the front to the rear, and a manual control 942 for participating in a hands-free telephone call. Manual controls corresponding to controls 936, 938 and 940 (not shown) for communicating with the middle interface 950 are also provided.

The middle interface 950 has a corresponding construction, as do any other middle, left or right interfaces.

Figure 27:
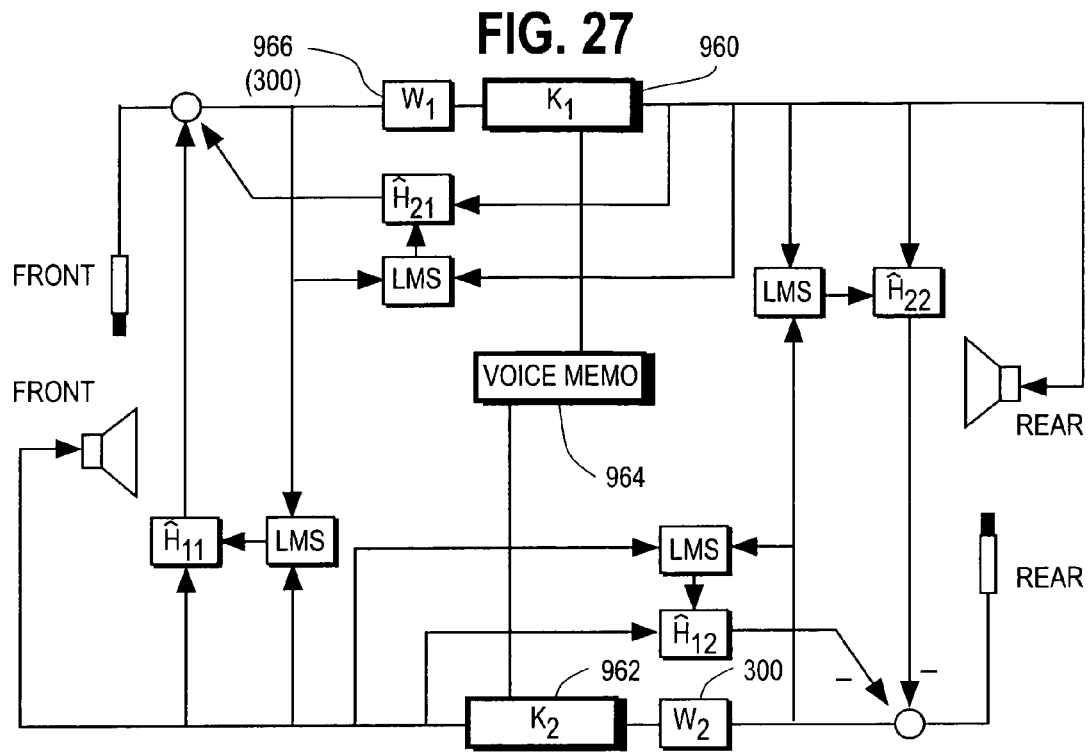
FIG. 27 is a diagram illustrating the incorporation of the inventive user interface in the inventive CCS.

The incorporation of the user interface 900 in the CCS is illustrated in FIG. 27, wherein the elements of the user interface are contained in box 960 (labeled "K 1"), box 962 (labeled "K2") and box 964 (labeled "Voice Memo"). The structure and connections may advantageously be entirely symmetric for any number of users. In a two input, two output vehicle system, such as the one in FIG. 3 and the one in FIG. 27, the structure is symmetric from front to back and from back to front. In a preferred embodiment, this symmetry holds for any number of inputs and outputs. It is possible, however, to any number of user interfaces with different functions available to each.

Figure 28:
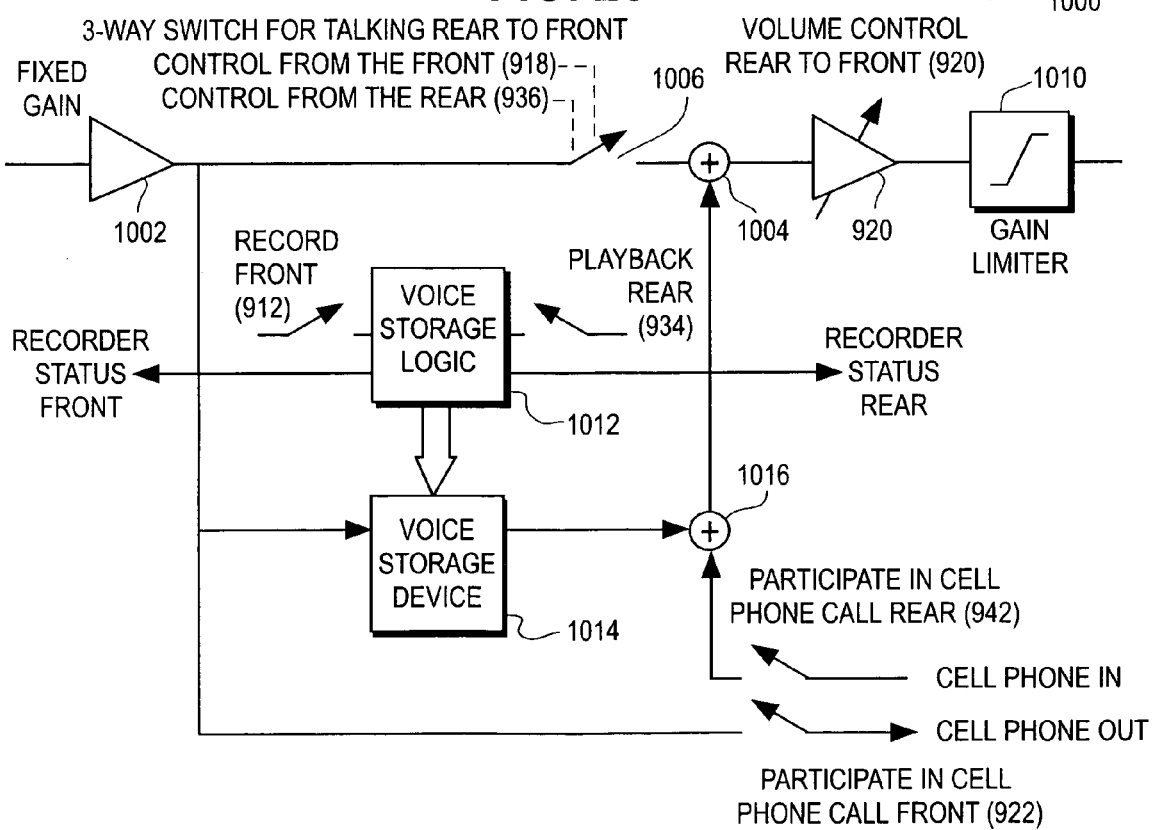
FIG. 28 is a schematic diagram illustrating the interior construction of a portion of the interface unit of FIG. 26.

Since the basic user interface is symmetric, it will be described in terms of K1 960 and the upper half of Voice Memo 964. The interior structure 1000 of K1 960 and the upper half of Voice Memo 964 are illustrated in FIG. 28, and it will be understood that the interior structure of K2 962 and the lower half of Voice Memo 964 are symmetrically identical thereto.

As shown in FIG. 27, the output of the Wiener SEF W1 966 (constructed as the SEF 300) is connected to K1 960. More specifically, as shown in FIG. 28, this output is fed to an amplifier 1002 with a fixed gain K1. The output of amplifier 1002 is connected to a summer 1004 under the control of a user interface three-way switch 1006. This switch 1006 allows or disallows connection of voice from the front to the rear via front user interface switch control 918. Similarly, rear user interface switch control 936 allows or disallows connection of voice from front to rear. The most recently operated switch control has precedence in allowing or disallowing connection.

There are several other options for precedence among the switches 918, 936. Either might have a fixed precedence over the other or the operation to disallow communication might have precedence to maintain privacy. In addition, a master lockout switch could be provided at the driver's seat, similar to a master lockout switch for electronic windows, to enable the driver to be free from distractions should he so desire.

The output of the summer 1004 is connected to the volume control 920, which is in the form of a variable amplifier for effecting volume control for a user in the rear position. This volume control 920 is limited by a gain limiter 1010 to preclude inadvertent excessive volume.

The output of the amplifier 1002 may also be sent to a cell phone via control 922. When activated, an amplified and noise filtered voice from the front microphone is sent to the cell phone for transmission to a remote receiver. Incoming cell phone signals may be routed to the rear via control 942. In a preferred embodiment, these are separate switches which, with their symmetric counterparts, allow any microphone signal to be sent to the cell phone and any incoming cell phone signal to be routed to any of the loudspeakers. It is possible, however, to make these switches three-way switches, with the most recently operated switch having precedence in allowing or disallowing connection.

The Voice Memo function consists of user interface controls, control logic 1012 and a voice storage device 1014. In a preferred embodiment, the voice storage device 1014 is a digital random access memory (RAM). However, any sequential access or random access device capable of digital or analog storage will suffice. In particular, Flash Electrically Erasable Programmable Read Only Memory (EEPROM) or ferro-electric digital memory devices may be used if preservation of the stored voice is desired in the event of a power loss.

The voice storage control logic 1012 operates under user interface controls to record, using for example control 912, and playback, using for example control 934, a voice message stored in the voice storage device 1014. In a preferred embodiment, the activation of control 912 stores the current digital voice sample from the front microphone in the voice storage device at an address specified by an address counter, increments the address counter and checks whether any storage remains unused. The activation of the playback control 934 resets the address counter, reads the voice sample at the counter's address for output via a summer 1016 to the rear loudspeaker, increments the address counter and checks for more voice samples remaining. The voice storage logic 1012 allows the storage of logically separate samples by maintaining separate start and ending addressed for the different messages. The symmetric controls (not shown) allow any user to record and playback from his own location.

The voice storage logic 1012 may also provide feedback to the use of the number of stored messages, their duration, the remaining storage capacity while recording and other information.

It will be understood that the interface can be designed for two, three or any plural number of users.

Although the invention has been shown and described with respect to exemplary embodiments thereof, it should be understood by those skilled in the art that the description is exemplary rather than limiting in nature, and that many changes, additions and omissions are possible without departing from the scope and spirit of the present invention, which should be determined from the following claims.

We claim:

1. A cabin communication system for improving clarity of a voice spoken within an interior cabin having ambient noise, said cabin communication system comprising:

an adaptive speech enhancement filter for receiving an audio signal that includes a first component indicative of the spoken voice, a second component indicative of a feedback echo of the spoken voice and a third component indicative of the ambient noise, said speech enhancement filter filtering the audio signal by removing the third component to provide a filtered audio signal, said speech enhancement filter adapting to the audio signal at a first adaptation rate;

an adaptive acoustic echo cancellation system for receiving the filtered audio signal and removing the second component in the filtered audio signal to provide an echo-cancelled audio signal, said echo cancellation system adapting to the filtered audio signal at a second adaptation rate; and random noise adding means for adding random noise to the filtered audio signal, said echo cancellation system using the filtered audio signal with the random noise added thereto to identify the second component, wherein the random noise is a dither signal, and wherein the cabin is movable at a variable velocity and the dither signal is scaled to the velocity;

wherein said first adaptation rate and said second adaptation rate are different from each other so that said speech enhancement filter does not adapt in response to operation of said echo-cancellation system and said echo-cancellation system does not adapt in response to operation of said speech enhancement filter.

2. The cabin communication system of claim 1, wherein said first adaptation rate is greater than said second adaptation rate.

3. The cabin communication system of claim 2, wherein said first adaptation rate of said speech enhancement filter is controlled by a step size $\beta$, wherein said second adaptation rate of said echo cancellation system is controlled by a step size $\mu$, and wherein $\beta$ is much less than $\mu$.

4. The cabin communication system of claim 3, wherein said audio signal is sampled at a sampling frequency $F_s$, wherein n is the number of samples of the audio signal accumulated for block processing by said speech enhancement filter, wherein said echo cancellation system includes a plurality of filters and a variable 1/k is the fraction of said plurality of filters that are updated each sampling period, and wherein:

$$\beta < < \frac{\mu}{k} < < \frac{F_s}{n}.$$

5. The cabin communication system of claim 1, wherein said first adaptation rate is an adaptation rate of a long term noise estimate by said speech enhancement filter, said first adaptation rate being much smaller than said second adaptation rate, and said second adaptation rate being much smaller than a basic filter rate of said speech enhancement filter.

6. A cabin communication system for improving clarity of a voice spoken within an interior cabin having ambient noise, said cabin communication system comprising:

an adaptive speech enhancement filter for receiving an audio signal that includes a first component indicative of the spoken voice, a second component indicative of a feedback echo of the spoken voice and a third component indicative of the ambient noise, said speech enhancement filter filtering the audio signal by removing the third component to provide a filtered audio signal; and an adaptive acoustic echo cancellation system for receiving the filtered audio signal and removing the second component in the filtered audio signal to provide an echo-cancelled audio signal, wherein said speech enhancement filter and said echo cancellation system are coupled, wherein said cabin communication performs a coupled on-line identification of noise and echoes in the audio signal to effect closed loop control of the adaptations of said speech enhancement filter and said echo cancellation system, wherein said speech enhancement filter adapts to the audio signal at a first adaptation rate and said echo cancellation system adapts to the filtered audio signal at a second adaptation rate, and wherein said first adaptation rate is greater than said second adaptation rate so that said speech enhancement filter does not adapt in response to operation of said echo cancellation system and said echo cancellation system does not adapt in response to operation of said speech enhancement filter, wherein said first adaptation rate of said speech enhancement filter is controlled by a step size $\beta$, wherein said second adaptation rate of said echo cancellation system is controlled by a step size $\mu$, and wherein $\beta$ is much less than $\mu$, and wherein said audio signal is sampled at a sampling frequency $F_s$, wherein n is the number of samples of the audio signal accumulated for block processing by said speech enhancement filter, wherein said echo cancellation system includes a plurality of filters and a variable 1/k is the fraction of said plurality of filters that are updated each sampling period, and wherein:

$$\beta < < \frac{\mu}{k} < < \frac{F_s}{n}.$$

7. The cabin communication system of claim 6, wherein said first adaptation rate is an adaptation rate of a long term noise estimate by said speech enhancement filter, said first adaptation rate being much smaller than said second adaptation rate, and said second adaptation rate being much smaller than a basic filter rate of said speech enhancement filter.

8. The cabin communication system of claim 6, further comprising random noise adding means for adding random noise to the filtered audio signal, said echo cancellation system using the filtered audio signal with the random noise added thereto to identify the second component.

9. The cabin communication system of claim 8, wherein the random noise is a dither signal.

10. The cabin communication system of claim 9, wherein the cabin is movable at a variable velocity and the dither signal is scaled to the velocity.

11. A cabin communication system for improving clarity of a voice spoken within an interior cabin having ambient noise, said cabin communication system comprising:

a microphone for receiving the spoken voice and the ambient noise and for converting the spoken voice and the ambient noise into a first audio signal, the first audio signal having a first component corresponding to the spoken voice and a second component corresponding to the ambient noise;

an adaptive speech enhancement filter for filtering the first audio signal by removing the second component to provide a filtered audio signal, said speech enhancement filter adapting to the first audio signal at a first adaptation rate;

an adaptive acoustic echo cancellation system for receiving the filtered audio signal and providing an echo-cancelled audio signal, said echo cancellation signal adapting to the filtered audio signal at a second adaptation rate; and a loudspeaker for converting the echo-cancelled audio signal into an output reproduced voice within the cabin including a third component indicative of the first audio signal, wherein said loudspeaker and said microphone are acoustically coupled so that the output reproduced voice is fed back from said loudspeaker to be received by said microphone and converted with the spoken voice into the first audio signal, wherein said echo cancellation system removes from the filtered audio signal any portion of the filtered audio signal corresponding to the third component, wherein said first adaptation rate is greater than said second adaptation rate so that said speech enhancement filter does not adapt in response to operation of said echo-cancellation system and said echo-cancellation system does not adapt in response to operation of said speech enhancement filter, wherein said first adaptation rate of said speech enhancement filter is controlled by a step size $\beta$, wherein said second adaptation rate of said echo cancellation system is controlled by a step size $\mu$, and wherein $\beta$ is much less than $\mu$, and wherein said first audio signal is sampled at a sampling frequency $F_s$, wherein n is the number of samples of the first audio signal accumulated for block processing by said speech enhancement filter, wherein said echo cancellation system includes a plurality of filters and a variable 1/k is the fraction of said plurality of filters that are updated each sampling period, and wherein:

$$\beta < < \frac{\mu}{k} < < \frac{F_s}{n}.$$

12. The cabin communication system of claim 11, wherein said first adaptation rate is an adaptation rate of a long term noise estimate by said speech enhancement filter, said first adaptation rate is much smaller than said second adaptation rate, and said second adaptation rate is much smaller than a basic filter rate of said speech enhancement filter.

13. The cabin communication system of claim 11, further comprising random noise adding means for adding random noise to the filtered audio signal, said echo cancellation system using the filtered audio signal with the random noise added thereto to identify the third component.

14. The cabin communication system of claim 13, wherein the random noise is a dither signal.

15. The cabin communication system of claim 14, wherein the cabin is movable at a variable velocity and the dither signal is scaled to the velocity.

16. A method for improving clarity of a voice spoken within an interior cabin having ambient noise, said method comprising the steps of:

adaptively filtering, for speech enhancement, an audio signal that includes a first component indicative of the spoken voice, a second component indicative of a feedback echo of the spoken voice and a third component indicative of the ambient noise, said filtering step removing the third component to provide a filtered audio signal, said filtering step adapting to the audio signal at a first adaptation rate; and adaptively processing the filtered audio signal to remove the second component by acoustic echo cancellation to provide an echo-cancelled audio signal, said processing step adapting to the filtered audio signal at a second adaptation rate, wherein said first adaptation rate is greater than said second adaptation rate so that said filtering step does not adapt in response to operation of said processing step and said processing step does not adapt in response to operation of said filtering step, wherein said first adaptation rate of said filtering step is controlled by a step size $\beta$, wherein said second adaptation rate of said processing step is controlled by a step size $\mu$, and wherein $\beta$ is much less than $\mu$, and wherein the first audio signal is sampled at a sampling frequency $F_s$, wherein n is the number of samples of the first audio signal accumulated for block processing by said speech enhancement filter, wherein said processing step uses a plurality of filters and a variable 1/k is the fraction of the plurality of filters that are updated each sampling period, and wherein:

$$\beta < < \frac{\mu}{k} < < \frac{F_s}{n}.$$

17. The method of claim 16, wherein said first adaptation rate is an adaptation rate of a long term noise estimate by said filtering step, said first adaptation rate being much smaller than said second adaptation rate, and said second adaptation rate being much smaller than a basic filter rate of said filtering step.

18. The method of claim 16, further comprising the step of adding random noise to the filtered audio signal, processing step using the filtered audio signal with the random noise added thereto to identify the second component.

19. The method of claim 18, wherein the random noise is a dither signal.

20. The method of claim 19, wherein the cabin is movable at a variable velocity and the dither signal is scaled to the velocity.

21. A movable vehicle cabin having ambient noise, said cabin comprising:

means for causing movement of said cabin, wherein at least a portion of the ambient noise during movement is a result of the movement; and a cabin communication system for improving clarity of a voice spoken within an interior of said cabin, wherein said cabin communication system comprises:

a microphone for receiving the spoken voice and the ambient noise and for converting the spoken voice and the ambient noise into a first audio signal, the first audio signal having a first component corresponding to the spoken voice and a second component corresponding to the ambient noise;

an adaptive speech enhancement filter for filtering the first audio signal by removing the second component to provide a filtered audio signal, said speech enhancement filter adapting to the first audio signal at a first adaptation rate;

an adaptive acoustic echo cancellation system for receiving the filtered audio signal and providing an echo-cancelled audio signal, said echo cancellation system adapting to the filtered audio signal at a second adaptation rate; and a loudspeaker for converting the echo-cancelled audio signal into an output reproduced voice within the cabin including a third component indicative of the first audio signal, wherein said loudspeaker and said microphone are acoustically coupled so that the output reproduced voice is fed back from said loudspeaker to be received by said microphone and converted with the spoken voice into the first audio signal, wherein said echo cancellation system removes from the filtered audio signal any portion of the filtered audio signal corresponding to the third component, wherein said first adaptation rate is greater than said second adaptation rate so that said speech enhancement filter does not adapt in response to operation of said echo-cancellation system and said echo-cancellation system does not adapt in response to operation of said speech enhancement filter, wherein said first adaptation rate of said speech enhancement filter is controlled by a step size $\beta$, wherein said second adaptation rate of said echo cancellation system is controlled by a step size $\mu$, and wherein $\beta$ is much less than $\mu$, and wherein said first audio signal is sampled at a sampling frequency $F_s$, wherein n is the number of samples of the first audio signal accumulated for block processing by said speech enhancement filter, wherein said echo cancellation system includes a plurality of filters and a variable 1/k is the fraction of said plurality of filters that are updated each sampling period, and wherein:

$$\beta < < \frac{\mu}{k} < < \frac{F_s}{n}.$$

22. The cabin of claim 21, wherein said first adaptation rate is an adaptation rate of a long term noise estimate by said speech enhancement filter, said first adaptation rate is much smaller than said second adaptation rate, and said second adaptation rate is much smaller than a basic filter rate of said speech enhancement filter.

23. The cabin of claim 21, further comprising random noise adding means for adding random noise to the filtered audio signal, said echo cancellation system using the filtered audio signal with the random noise added thereto to identify the third component.

24. The cabin of claim 23, wherein the random noise is a dither signal.

25. The cabin of claim 24, wherein the cabin is movable at a variable velocity and the dither signal is scaled to the velocity.

* * * * *